(12) United States Patent
Lee et al.

(10) Patent No.: US 8,198,619 B2
(45) Date of Patent: Jun. 12, 2012

(54) PHASE CHANGE MEMORY CELL STRUCTURE

(75) Inventors: Ming-Hsiu Lee, Hsinchu (TW); Chieh-Fang Chen, Banciao (TW)

(73) Assignee: Macronix International Co., Ltd., Hsinchu (TW)

( * ) Notice: Subject to any disclaimer, the term of this patent is extended or adjusted under 35 U.S.C. 154(b) by 190 days.

(21) Appl. No.: 12/534,599

(22) Filed: Aug. 3, 2009

(65) Prior Publication Data

US 2011/0012083 A1  Jan. 20, 2011

Related U.S. Application Data

(60) Provisional application No. 61/271,010, filed on Jul. 15, 2009.

(51) Int. Cl.
*H01L 47/00* (2006.01)

(52) U.S. Cl. ............. 257/4; 257/E47.001; 257/E21.075; 438/102; 438/128

(58) Field of Classification Search ....... 257/4, E47.001, 257/E21.068, E21.075; 438/102, 128
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 3,846,767 A | 11/1974 | Cohen | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |

(Continued)

FOREIGN PATENT DOCUMENTS

WO 2004025659 A1 3/2004

OTHER PUBLICATIONS

"Magnetic Bit Boost," www.sciencenews.org, Dec. 18 & 25, 2004, p. 389, vol. 166.

(Continued)

*Primary Examiner* — Wensing Kuo
(74) *Attorney, Agent, or Firm* — Haynes Beffel & Wolfeld LLP

(57) ABSTRACT

A memory cell described herein includes a memory element comprising programmable resistance memory material overlying a conductive contact. An insulator element includes a pipe shaped portion extending from the conductive contact into the memory element, the pipe shaped portion having proximal and distal ends and an inside surface defining an interior, the proximal end adjacent the conductive contact. A bottom electrode contacts the conductive contact and extends upwardly within the interior from the proximal end to the distal end, the bottom electrode having a top surface contacting the memory element adjacent the distal end at a first contact surface. A top electrode is separated from the distal end of the pipe shaped portion by the memory element and contacts the memory element at a second contact surface, the second contact surface having a surface area greater than that of the first contact surface.

15 Claims, 19 Drawing Sheets

U.S. PATENT DOCUMENTS

| | | | |
|---|---|---|---|
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,075,719 A | 6/2000 | Lowrey et al. | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,337,266 B1 | 1/2002 | Zahorik | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,106 B1 | 11/2002 | Kozicki | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,512,263 B1 | 1/2003 | Yuan et al. | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,720,240 B2 | 4/2004 | Gole et al. | |
| 6,744,088 B1 | 6/2004 | Dennison | |
| 6,750,079 B2 | 6/2004 | Lowrey et al. | |
| 6,750,101 B2 | 6/2004 | Lung | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,815,704 B1 | 11/2004 | Chen | |
| 6,831,017 B1 | 12/2004 | Li et al. | |
| 6,838,692 B1 | 1/2005 | Lung et al. | |
| 6,850,432 B2 | 2/2005 | Lu et al. | |
| 6,859,389 B2 | 2/2005 | Idehara | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen | |
| 6,998,289 B2 | 2/2006 | Hudgens et al. | |
| 7,023,008 B1 | 4/2006 | Happ | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,099,180 B1 | 8/2006 | Dodge et al. | |
| 7,115,927 B2 | 10/2006 | Hideki et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,126,847 B2 | 10/2006 | Ha et al. | |
| 7,132,675 B2 | 11/2006 | Gilton | |
| 7,151,273 B2 | 12/2006 | Campbell et al. | |

| Patent/Publication | Date | Inventor |
|---|---|---|
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,262,502 B2 | 8/2007 | Chang |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,569,844 B2 | 8/2009 | Lung |
| 7,683,360 B2 | 3/2010 | Chen et al. |
| 7,855,378 B2 * | 12/2010 | Lin et al. ............ 257/4 |
| 2002/0017701 A1 | 2/2002 | Klersy et al. |
| 2002/0070457 A1 | 6/2002 | Sun et al. |
| 2002/0113273 A1 | 8/2002 | Hwang et al. |
| 2002/0168852 A1 | 11/2002 | Harshfield et al. |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2003/0189202 A1 | 10/2003 | Li et al. |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0018156 A1 | 1/2006 | Happ |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0169968 A1 | 8/2006 | Happ |
| 2006/0172067 A1 | 8/2006 | Ovshinsky et al. |
| 2006/0175597 A1 | 8/2006 | Happ |
| 2006/0175599 A1 | 8/2006 | Happ |
| 2006/0192193 A1 | 8/2006 | Lee et al. |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0001936 A1 | 1/2007 | Kawakami et al. |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0111503 A1 | 5/2007 | Jeon et al. |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |

| | | | |
|---|---|---|---|
| 2007/0156949 A1 | 7/2007 | Rudelic et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0170881 A1 | 7/2007 | Noh et al. | |
| 2007/0173019 A1 | 7/2007 | Ho et al. | |
| 2007/0173063 A1 | 7/2007 | Lung | |
| 2007/0176261 A1 | 8/2007 | Lung | |
| 2007/0187664 A1 | 8/2007 | Happ | |
| 2007/0201267 A1 | 8/2007 | Happ et al. | |
| 2007/0215852 A1 | 9/2007 | Lung | |
| 2007/0224726 A1 | 9/2007 | Chen et al. | |
| 2007/0235811 A1 | 10/2007 | Furukawa et al. | |
| 2007/0236989 A1 | 10/2007 | Lung | |
| 2007/0246699 A1 | 10/2007 | Lung | |
| 2007/0249090 A1 | 10/2007 | Philipp et al. | |
| 2007/0252127 A1 | 11/2007 | Arnold et al. | |
| 2007/0257300 A1 | 11/2007 | Ho et al. | |
| 2007/0262388 A1 | 11/2007 | Ho et al. | |
| 2007/0267618 A1 | 11/2007 | Zaidi et al. | |
| 2007/0274121 A1 | 11/2007 | Lung et al. | |
| 2007/0285960 A1 | 12/2007 | Lung et al. | |
| 2007/0298535 A1 | 12/2007 | Lung | |
| 2008/0006811 A1 | 1/2008 | Philipp et al. | |
| 2008/0012000 A1 | 1/2008 | Harshfield | |
| 2008/0014676 A1 | 1/2008 | Lung et al. | |
| 2008/0025089 A1 | 1/2008 | Scheuerlein et al. | |
| 2008/0043520 A1 | 2/2008 | Chen | |
| 2008/0048169 A1 | 2/2008 | Doyle et al. | |
| 2008/0094871 A1 | 4/2008 | Parkinson | |
| 2008/0101110 A1 | 5/2008 | Happ et al. | |
| 2008/0106923 A1 | 5/2008 | Lung | |
| 2008/0137400 A1 | 6/2008 | Chen et al. | |
| 2008/0138929 A1 | 6/2008 | Lung | |
| 2008/0138930 A1 | 6/2008 | Lung | |
| 2008/0138931 A1 | 6/2008 | Lung | |
| 2008/0164453 A1 | 7/2008 | Breitwisch et al. | |
| 2008/0165569 A1 | 7/2008 | Chen et al. | |
| 2008/0165570 A1 | 7/2008 | Happ et al. | |
| 2008/0165572 A1 | 7/2008 | Lung | |
| 2008/0166875 A1 | 7/2008 | Lung | |
| 2008/0179582 A1 | 7/2008 | Burr et al. | |
| 2008/0180990 A1 | 7/2008 | Lung | |
| 2008/0186755 A1 | 8/2008 | Lung et al. | |
| 2008/0191187 A1 | 8/2008 | Lung et al. | |
| 2008/0192534 A1 | 8/2008 | Lung | |
| 2008/0197334 A1 | 8/2008 | Lung | |
| 2008/0224119 A1 | 9/2008 | Burr et al. | |
| 2008/0225489 A1 | 9/2008 | Cai et al. | |
| 2008/0265234 A1 | 10/2008 | Breitwisch et al. | |
| 2008/0303014 A1 | 12/2008 | Goux et al. | |
| 2008/0310208 A1 | 12/2008 | Daley | |
| 2009/0001341 A1 | 1/2009 | Breitwisch et al. | |
| 2009/0014704 A1 | 1/2009 | Chen et al. | |
| 2009/0023242 A1 | 1/2009 | Lung | |
| 2009/0027950 A1 | 1/2009 | Lam et al. | |
| 2009/0042335 A1 | 2/2009 | Lung | |
| 2009/0057641 A1 | 3/2009 | Lung | |
| 2009/0072215 A1 | 3/2009 | Lung et al. | |
| 2009/0098678 A1 | 4/2009 | Lung | |
| 2009/0166603 A1 | 7/2009 | Lung | |
| 2009/0225588 A1* | 9/2009 | Czubatyj et al. | 365/163 |
| 2009/0268507 A1 | 10/2009 | Breitwisch et al. | |
| 2009/0289242 A1 | 11/2009 | Breitwisch et al. | |
| 2009/0294748 A1 | 12/2009 | Breitwisch et al. | |
| 2010/0055830 A1 | 3/2010 | Chen et al. | |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21 to 23, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005. 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage, " Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et-al.,"Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses" IEEE Transactions on Electron Devices, vol. Ed. 20, No. 2, Feb. 1973, pp. 105-122.

Pellizer, F. et al.,"Novel u Trench Phase -Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n. Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future" (Conference Proceedings Paper), Jul. 30, 1997, vol: 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates, " Mat. Res. Soc. Symp. Proc., vol. 106, 1998, pp. 21-26.

Hersee, S.D. et. al., "GaN nanowire light emitting diodes based on templated and scalable nanowire growth process," Electronics Letters, Jan. 1, 2009, vol. 45 No. 1, 2 pgs.

* cited by examiner

| Material | Thermal Conductivity K (J/cm K s) | Specific Heat C (J/cm³K) | Thermal Diffusivity α (cm²/s) |
|---|---|---|---|
| TiN | 0.28(25°C) 0.11(650°C) | 4.11 | 0.680 |
| TiW | 0.6 | 2.04 | 0.290 |
| TiAlN | 0.3 | 0.7 | 0.420 |
| SiO2 | 0.014 (600°C) | 3.1 | 0.004 |
| Si3N4 | 0.3(RT) 0.15(500°C) | 1.4 | 0.014 |
| Al2O3 | 0.18 | 3.25 | 0.045 |
| a- GST | 0.003 | 1.25 | 0.0025 – 0.015 |
| fcc- GST | 0.0045 | | |
| hcp- GST | 0.014 | | |
| Air | 0.00025 | 0.0012 | 0.24 |

Fig. 3C

PHASE CHANGE MEMORY CELL STRUCTURE

RELATED APPLICATIONS

This application claims the benefit of U.S. Provisional Application No. 61/271,010 filed on 15 Jul. 2009.

PARTIES TO A JOINT RESEARCH AGREEMENT

International Business Machines, a New York corporation, and Macronix International Corporation, Ltd., a Taiwan corporation, are parties to a Joint Research Agreement.

BACKGROUND OF THE INVENTION

1. Field of the Invention

The present invention relates to memory devices based on phase change memory materials, including chalcogenide based materials and other programmable resistance materials, and methods for operating such devices.

2. Description of Related Art

Phase change based memory materials, like chalcogenide based materials and similar materials, can be caused to change phase between an amorphous and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistance material to form nonvolatile memory circuits, which can be read and written with random access.

The change from the amorphous to the crystalline, referred to as set herein, is generally a lower current operation in which current heats the phase change material above a transition temperature to cause a transition of an active region from the amorphous to the crystalline phase. The change from the crystalline to the amorphous, referred to as reset herein, is generally a higher current operation, which includes a short high current density pulse to melt or breakdown the crystalline structure, after which phase change material cools quickly, quenching the phase change process and allowing at least a portion of the active region of the phase change material to stabilize in the amorphous phase. Techniques are applied to make the active region small, so that the amount of current needed to induce the phase change is reduced.

The magnitude of the current needed can be reduced by reducing the size of the phase change material element and/or the size of electrodes in contact with the phase change material element, so that higher current densities are achieved in the active region with small absolute current values.

One approach to controlling the size of the active region is to devise very small electrodes for delivering current to a body of phase change material. This small electrode structure concentrates current in a small area like the head of a mushroom, at the location of the contact. See, U.S. Pat. No. 6,429,064, issued Aug. 6, 2002 to Wicker, "Reduced Contact Areas of Sidewall Conductor"; U.S. Pat. No. 6,462,353, issued Oct. 8, 2002, to Gilgen, "Method for Fabricating a Small Area of Contact Between Electrodes"; U.S. Pat. No. 6,501,111, issued Dec. 31, 2002, to Lowrey, "Three-Dimensional (3D) Programmable Device"; U.S. Pat. No. 6,563,156, issued Jul. 1, 2003, to Harshfield, "Memory Elements and Methods for Making Same".

Another approach to controlling the size of the active region includes spacing the electrodes in such a way that current flowing therebetween is concentrated by the thickness of a thin layer of phase change material. See, U.S. Patent Application Publication No. US 2007/0048945, entitled "Memory Device and Method of Making Same", by Czubatyj, et al. See also the following applications and patents commonly owned by the assignee of the present application: U.S. patent application Ser. No. 11/864,273, filed 28 Sep. 2007, entitled "Memory Cell Having A Side Electrode Contact", by Lung; U.S. Pat. No. 7,463,512, issued 9 Dec. 2008, entitled "Memory Element with Reduced-Current Phase Change Element", by Lung; U.S. application Ser. No. 12/023,978, filed 7 Aug. 2008, entitled "Memory Cell Device with Coplanar Electrode Surface and Method", by Lung.

A specific issue arising from conventional phase change memory cell structures is the heat sink effect of electrodes in contact with the phase change material. Because the phase change occurs as a result of heating, the thermal conductivity of the electrodes will act to draw heat away from the active region, resulting in a need for a higher current to induce the desired phase change.

Higher current levels can result in electrical and mechanical reliability problems for the memory cell. These problems include the formation of voids at the phase change material/electrode interface due to mechanical stress caused by thermal expansion and material density changes during operation.

Additionally, higher current levels can result in problems such as localized heating sufficient to induce diffusion/reaction of electrode and phase change material, and/or cause compositional changes in the phase change material within the active region, resulting in resistive switching performance degradation and possible failure of the memory cell.

Thus, various techniques are used in an attempt to thermally isolate the active region so that the resistive heating needed to induce the phase change is confined to the active region.

One approach to improving thermal isolation includes using gaps or voids adjacent the phase change material. See U.S. Pat. No. 6,815,704, issued 9 Nov. 2004, entitled "Phase Change Memory Device Employing Thermally Insulating Voids", by Chen.

It has also been proposed to use thermally insulating materials to improve the confinement of heat to the active region. See, for example, U.S. patent application Ser. No. 11/940,164, filed 14 Nov. 2007, entitled "Phase Change Memory Cell Including Thermal Protect Bottom Electrode and Manufacturing Methods", by Chen.

Another approach to improving thermal isolation includes forming the phase change material and electrodes in a way that tends to space the active region from the electrodes. See the following applications commonly owned by the assignee of the present application: U.S. patent application Ser. No. 11/348,848, filed 7 Sep. 2006, entitled "I-Shaped Phase Change Memory Cell", by Chen et al.; U.S. patent application Ser. No. 11/952,646, filed 7 Dec. 2007, entitled "Phase Change Memory Cell Having Interface Structures with Essentially Equal thermal Impedances and Manufacturing Methods", by Lung; U.S. application Ser. No. 12/026,342, filed 5 Feb. 2005, entitled "Heating Center PCRAM Structure and Methods for Making", by Chen.

Accordingly, an opportunity arises to devise phase change memory cell structures requiring a small amount of current to induce phase change in the active region. Furthermore, it is desirable to provide methods for manufacturing such devices.

SUMMARY OF THE INVENTION

Phase change based memory cells having small operational currents are described herein. The memory cells described herein reduce the amount of heat drawn away from the active region of the memory element, effectively increasing the amount of heat generated within the active region per unit value of current and thus reducing the amount of current required to induce a phase change.

A memory device as described herein includes a conductive contact and a memory element comprising programmable resistance memory material overlying the conductive contact. An insulator element includes a pipe shaped portion extending from the conductive contact into the memory element, the pipe shaped portion having proximal and distal ends and an inside surface defining an interior. The proximal end is adjacent the conductive contact.

The memory device further includes a bottom electrode contacting the conductive contact and extending upwardly within the interior from the proximal end to the distal end. The bottom electrode has a top surface contacting the memory element adjacent the distal end at a first contact surface. A top electrode is separated from the distal end of the pipe shaped portion by the memory element and contacts the memory element at a second contact surface. The second contact surface has a surface area greater than that of the first contact surface.

The active region is the region of the memory element in which the memory material is induced to change between at least two solid phases. The active region can be made extremely small in the illustrated structure, thus reducing the magnitude of the current needed to induce a phase change. In embodiments the width of the bottom electrode is less than the width of the top electrode and memory element. The width of the bottom electrode is preferably less than a minimum feature size for a process, typically a lithographic process, used to form the memory cell. The small width and contact surface of the bottom electrode concentrates current in the active region adjacent the top surface of the bottom electrode, thereby reducing the magnitude of current needed to induce a phase change in the active region.

In addition, the bottom electrode can act as a heater, because of its high resistivity in certain embodiments, inducing a greater temperature change in the active region for a given current flow than would otherwise occur, thus improving the efficiency of the phase change in the active region.

Furthermore, the small width of the bottom electrode provides a high thermal resistance path through the bottom electrode, thus restricting the amount of heat flow away from the active region of the memory element through the bottom electrode.

Since the memory element surrounds the outer surface of the pipe shaped portion, the active region is inside the volume of memory material of the memory element, and thus is spaced away from the conductive contact and the top electrode. The remaining portions of the memory element can therefore provide thermal isolation to the active region from the base portion and the top electrode, which reduces the amount of current necessary to induce a phase change. In embodiments the memory material of the memory element can have a thermal conductivity (k) in the highest thermal conductivity state less than that of the dielectric material of insulator element.

In addition, having the active region inside the volume of memory material avoids etch damage issues to the active region.

In some embodiments the memory cells described herein include two or more bottom electrodes and a corresponding two or more pipe shaped portions.

In another embodiment the bottom electrode is ring-shaped and has an inner surface defining an interior containing electrically insulating fill material.

Other aspects and advantages of the present invention can be seen on review of the drawings, the detailed description, and the claims which follow.

BRIEF DESCRIPTION OF THE DRAWINGS

FIG. 3C is a table showing typical thermal properties of some commonly used materials, along with thermal properties of GST memory material.

DETAILED DESCRIPTION

A detailed description of embodiments of the present invention is provided with reference to the FIGS. 1-16.

Figure 1:
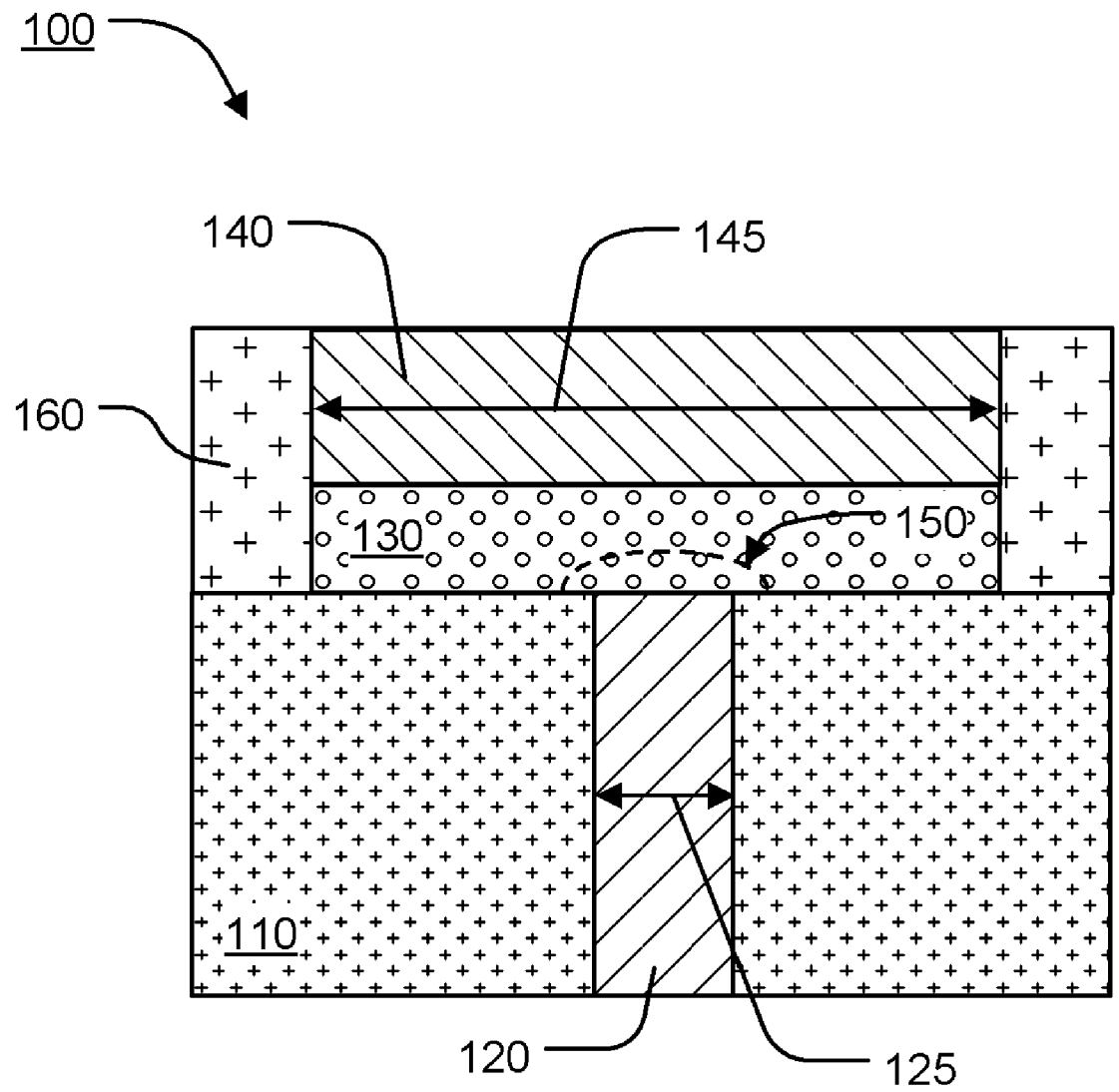
FIG. 1 illustrates a cross-sectional view of a prior art "mushroom-type" memory cell.

FIG. 1 illustrates a cross-sectional view of a prior art "mushroom-type" memory cell 100 having a bottom electrode 120 extending through a dielectric layer 110, a phase change memory element 130 comprising a layer of phase change material on the bottom electrode 120, and a top electrode 140 on the phase change memory element 130. A dielectric layer 160 surrounds the phase change memory element 130. As can be seen in FIG. 1, the bottom electrode 120 has a width 125 less than the width 145 of the top electrode 140 and phase change material 130.

In operation, voltages on the top and bottom electrodes 140, 120 induce a current to flow from the top electrode 140 to the bottom electrode 120, or vice-versa, via the phase change memory element 130.

The active region 150 is the region of the phase change memory element 130 in which the phase change material is induced to change between at least two solid phases. Due to the differences in the widths 125 and 145, in operation the current density is concentrated in the region of the phase change memory element 130 adjacent the bottom electrode 120, resulting in the active region 150 having a "mushroom" shape as shown in FIG. 1.

Because the phase change in the active region 150 occurs as a result of heating, the thermal conductivity of the bottom electrode 120 and the dielectric 110 will act to draw heat away from the active region and result in a significant amount of heat loss. The high heat loss results in a need for higher current to induce the desired change in the active region 150.

Figure 2:
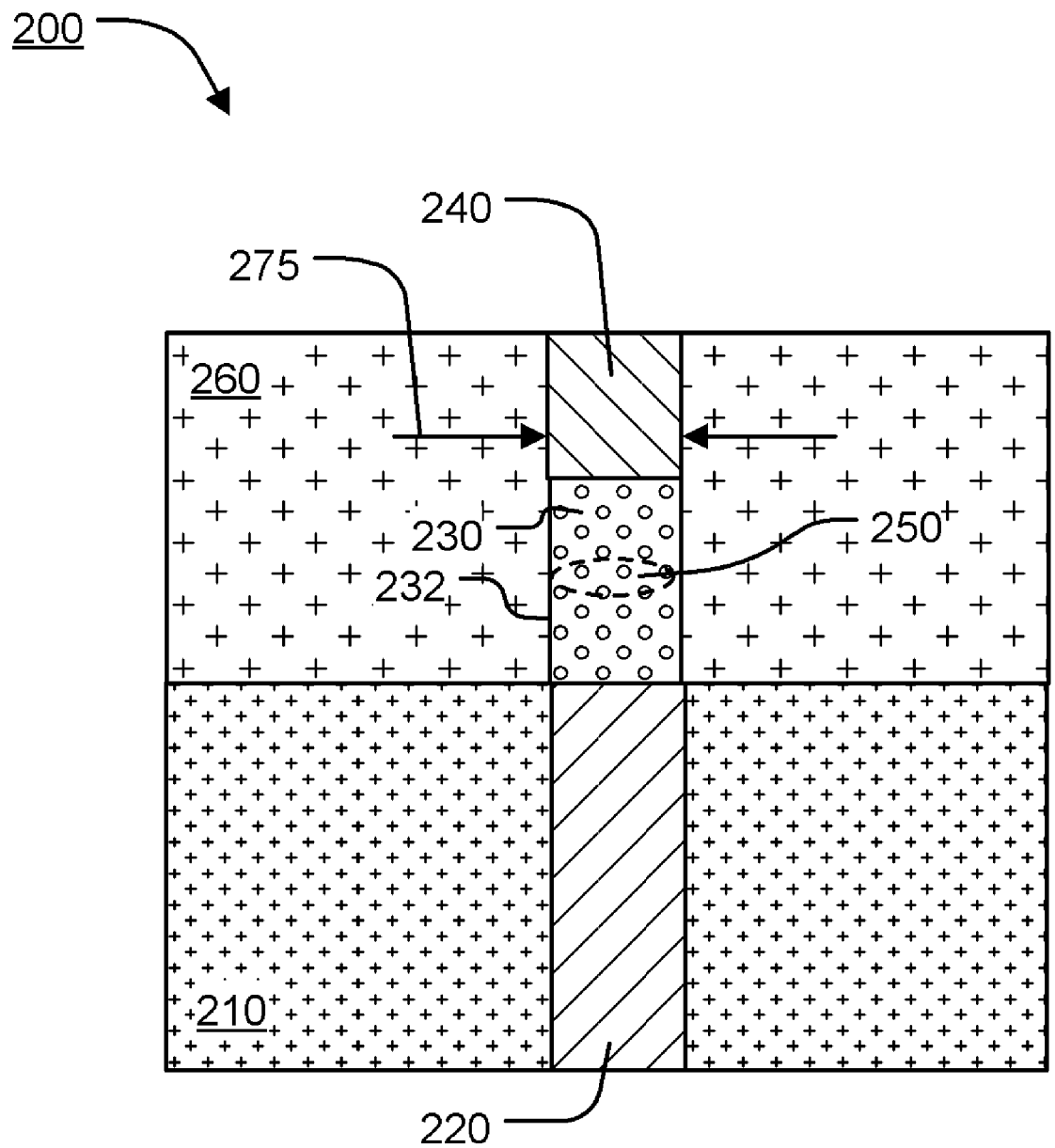
FIG. 2 illustrates a cross-sectional view of a prior art "pillar-type" memory cell.

FIG. 2 illustrates a cross-sectional view of a prior art "pillar-type" memory cell 200. The memory cell 200 includes a bottom electrode 220 in a dielectric layer 210, a pillar of phase change material 230 on the bottom electrode 220, and a top electrode 240 on the pillar of phase change material 230. A dielectric layer 260 surrounds the pillar of phase change material 230. As can be seen in the Figure, the top and bottom electrodes 240, 220 have the same width 275 as that of the pillar of phase change material 230. Thus, the active region 250 can be spaced away from the top and bottom electrodes 240, 220, resulting in a reduced heat sink effect by the top and bottom electrodes 240, 220. However, there is heat loss through the sidewalls 232 of the phase change material 230 to the dielectric layer 260 due to the proximity of the active region 250 to the dielectric layer 260.

Additionally, the pillar of phase change material 230 may be formed by depositing a phase change material layer on the bottom electrode 220 and dielectric 210 and subsequently etching the phase change material layer to form the pillar 230. Problems have arisen in manufacturing such devices due to etch damage to the sidewalls 232 of the pillar of memory material 230 and alignment tolerance issues between the pillar of memory material 230 and the bottom electrode 220.

Figure 3A:
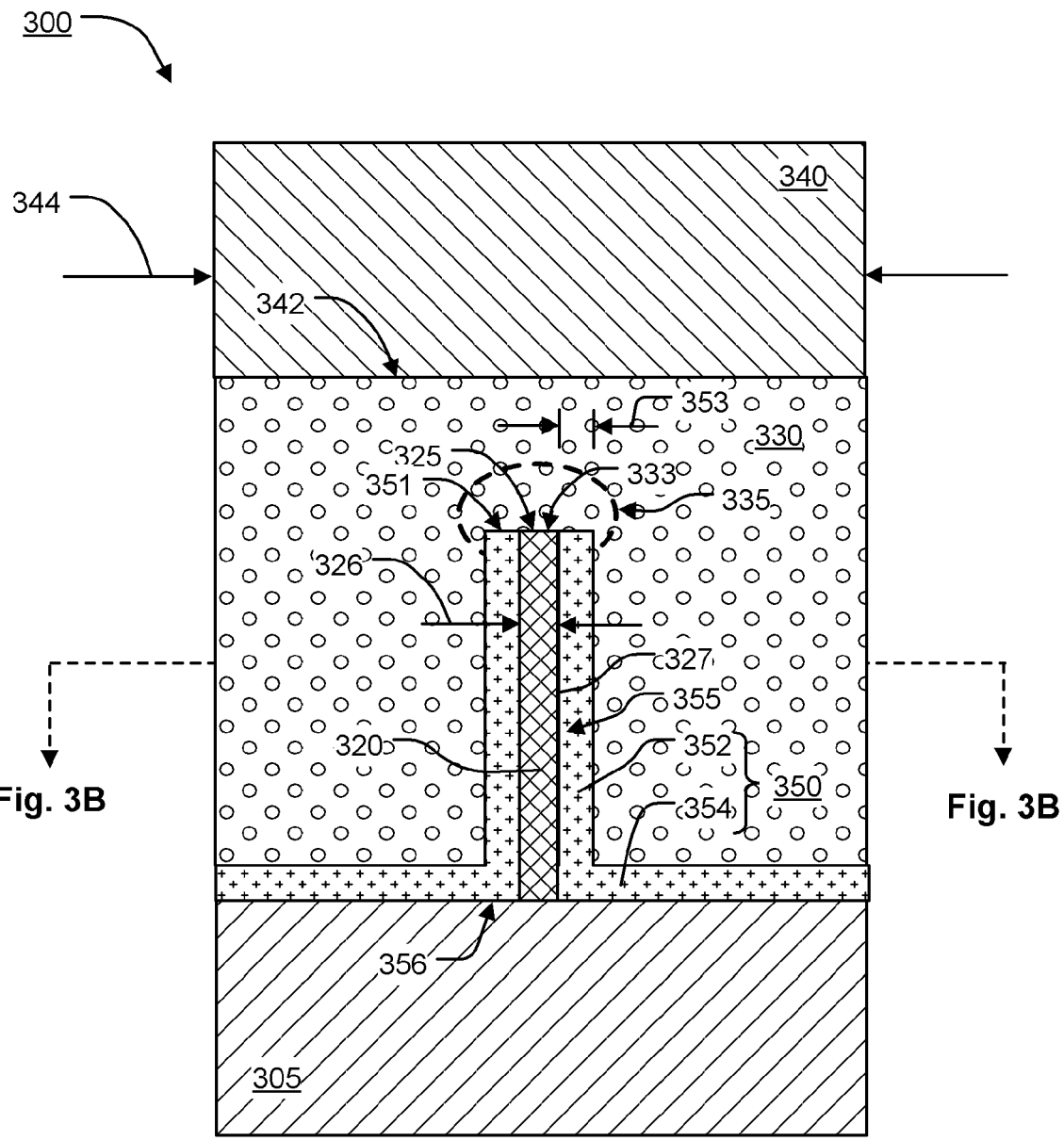
FIGS. 3A and 3B are cross-sectional and top views respectively of a first embodiment of a memory cell described herein.

FIG. 3A is a cross-sectional view of a first embodiment of a memory cell 300 addressing the heat sink issues described above and thus having a small operational current.

The memory cell 300 includes a conductive contact 305 and a programmable resistance memory element 330 overlying the conductive contact 305. The conductive contact 305 couples the memory cell 300 to underlying access circuitry (not shown) such as a transistor or diode. The conductive contact 305 comprises a refractory metal such as tungsten in the illustrated embodiment. Other metals that could be used include Ti, Mo, Al, Ta, Cu, Pt, Ir, La, Ni, and Ru. Other contact structures and materials can be used as well. For example, the conductive contact 305 may be a silicide or may comprise a doped semiconductor material which is a drain or source region of an access transistor or a terminal of a diode.

The memory element 330 comprises programmable resistance memory material and may comprise, for example, one or more materials from the group of Zn, To, Tl, Ge, Sb, Te, Se, In, Ti, Ga, Bi, Sn, Cu, Pd, Pb, Ag, S, Si, O, P, As, N and Au The memory cell 300 also includes an insulator element 350 including a pipe shaped portion 352 extending from the conductive contact 305 into the memory element 330. The pipe shaped portion 352 has a proximal end 356 adjacent the conductive contact 305 and a distal end 351. The pipe shaped portion 352 has an inside surface 355 defining an interior, and in the illustrated embodiment the interior of the pipe shaped portion 352 has substantially the same width at the proximal and distal ends 356, 351. As used herein, the term "substantially" is intended to accommodate manufacturing tolerances.

The insulator element 350 also has a base portion 354 at the proximal end 356 of the pipe shaped portion 352. The base portion 354 is on the top surface of the conductive contact 305 to separate the conductive contact 305 from the memory element 330.

The insulator element 350 comprises dielectric material, and in the illustrated embodiment comprises $SiO_2$. Alternatively, the insulator element 350 may comprise other dielectric materials, for example SiN or $Al_2O_3$.

A bottom electrode 320 contacts the conductive contact 305 and extends upwardly within the interior of the pipe shaped portion 352 from the proximal end 356 to the distal end 351. The bottom electrode 320 has an outer surface 327 surrounded by the inside surface 355 of the pipe shaped portion 352. The bottom electrode 320 also has a top surface 325 contacting memory material of the memory element 330 adjacent the distal end 351 at first contact surface 333.

The bottom electrode 320 may comprise, for example, TiN or TaN. TiN may be preferred in embodiments in which the memory element 330 comprises GST (discussed below) because is makes a good contact with GST, it is a common material used in semiconductor manufacturing, and it provides a good diffusion barrier at the higher temperatures at which GST transitions, typically in the 600-7000 C range. Alternatively, the bottom electrode 320 may be W, WN, TiAlN or TaAlN, or comprise, for further examples, one or more elements selected from the group consisting of doped-Si, Si, Ge, C, Ge, Cr, Ti, W, Mo, Al, Ta, Cu, Pt, Ir, La, Ni, N, O, and Ru and combinations thereof.

In some embodiments the bottom electrode 320 comprises a heater material having an electrical resistivity greater than that of the material of the conductive contact 305. The material of the bottom electrode 320 may also, for example, comprise a material having a resistivity greater than that of the highest resistance state of the material of the memory element 330.

In certain embodiments the bottom electrode 320 comprises doped semiconductor material having a first conductivity type, and the conductive contact 305 comprises doped semiconductor material having a second conductivity type opposite the first conductivity type, thereby forming a p-n junction therebetween acting as a diode access device or a portion of a transistor access device.

The top surface 325 of the bottom electrode 320 is substantially coplanar with the top surface of the pipe shaped portion 352 at the distal end 351. As used herein, the term "substantially coplanar" is intended to accommodate manufacturing tolerances during the formation of the bottom electrode and insulator element 350, as well as accommodate manufacturing processes performed following formation of the bottom electrode 320 and insulator element 350 which may cause variations in the planarity of the top surfaces 325, 351.

Figure 3B:
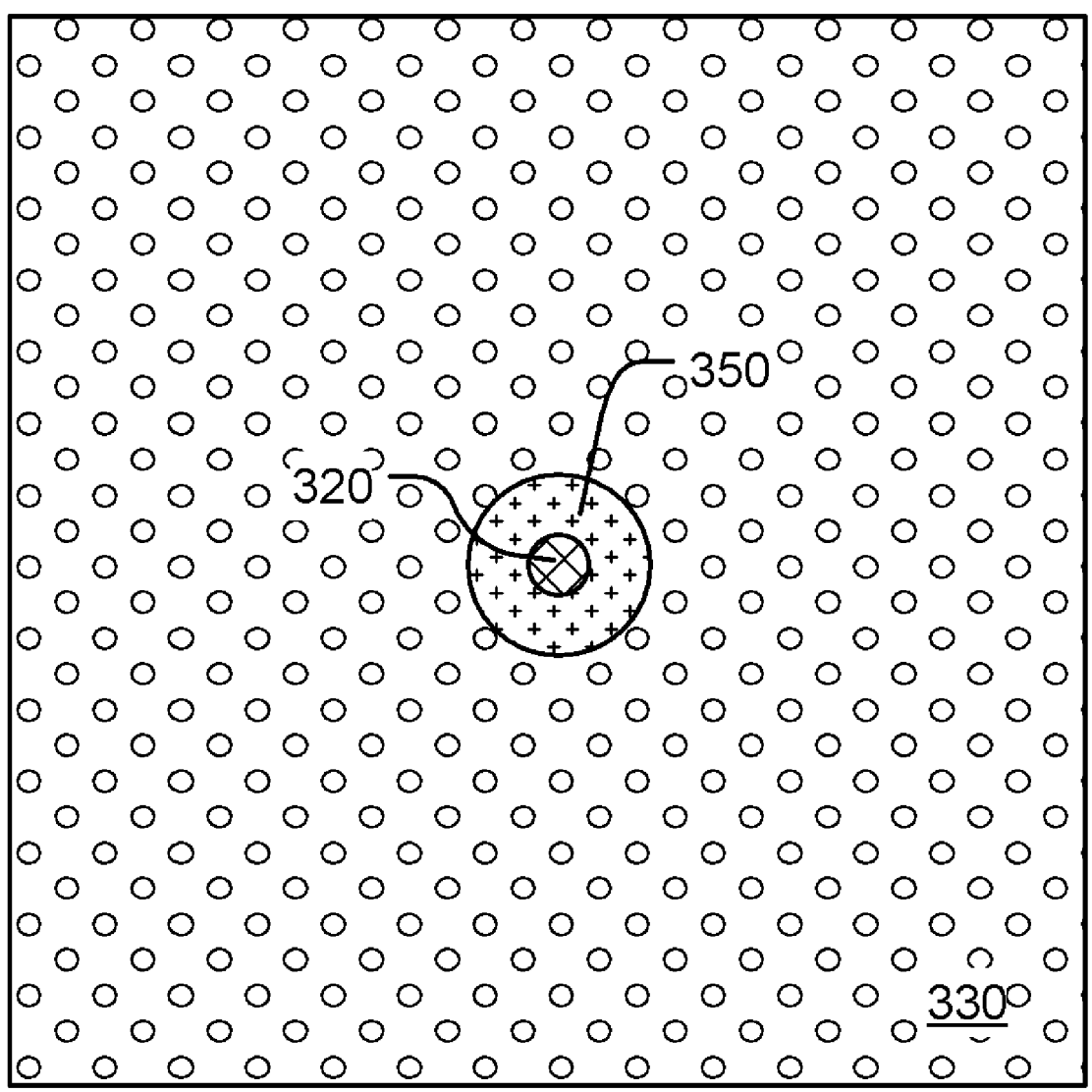

As shown in the top view of FIG. 3B, in the illustrated embodiment the bottom electrode 320 and the pipe shaped portion 352 each have a circular cross-section. However, in embodiments the bottom electrode 320 and the sidewall insulator element 350 may have a cross-section that is circular, elliptical, square, rectangular or somewhat irregularly shaped, depending on the manufacturing technique applied to form the pillar portion 324 and the sidewall insulator element 350.

Referring back to the cross-section of FIG. 3A, the memory element 330 contacts the top surface 325 of the bottom electrode 320 to electrically couple the bottom electrode 320 to top electrode 340. The memory element 330 also extends below the top surface of the pipe shaped element 352 to contact the outer surface of the element 352. As a result, the memory element 330 surrounds portions of the insulator element 350 and the bottom electrode 320.

The memory cell 300 also includes top electrode separated from the distal end of the pipe shaped portion 352 by memory material of the memory element 330. The top electrode 340 contacts the memory element 330 at a second contact surface 342. The second contact surface 342 has a surface area greater than that of the first contact surface 333.

The top electrode 340 may comprise, for example, one or more of the materials discussed above with reference to the bottom electrode 320, and in some embodiments may comprise more than one layer. For example, the bottom electrode 320 may comprise a first material contacting the memory element 330 and chosen for compatibility with the material of memory element, and a second material on the first and chosen for other advantages such as a lower electrical resistivity. In some embodiments the top electrode 340 may comprise a portion of a bit line.

In operation, voltages on the top electrode 340 and the bottom electrode 320 include a current to flow from the top electrode 340 to the bottom electrode 320, or vice versa, through the memory element 330 via contact surfaces 333, 342.

The active region 335 is the region of the memory element 330 in which the memory material is induced to change between at least two solid phases. As can be appreciated, the active region 335 can be made extremely small in the illustrated structure, thus reducing the magnitude of the current needed to induce a phase change. The width 326 of the bottom electrode 320 is less than the width 344 of the top electrode 340, and thus the second contact surface 342 has a surface area greater than that of the first contact surface 333. The width 326 is preferably less than a minimum feature size for a process, typically a lithographic process, used to form the memory cell 300. The small width 326 and contact surface 333 in the active region 335 adjacent the top surface 325 of the bottom electrode 320, thereby reducing the magnitude of current needed to induce a phase change in the active region 335.

In addition, the bottom electrode 320 can act as a heater, because of its high resistivity in certain embodiments, inducing a greater temperature change in the active region 335 for a given current flow than would otherwise occur, thus improving the efficiency of the phase change in the active region 335.

Furthermore, the small width 326 of the bottom electrode 320 provides a high thermal resistance path through the bottom electrode 320, thus restricting the amount of heat flow away from the active region 335 of the memory element 330 through the bottom electrode 320.

Since the memory element 330 surrounds the outer surface of the pipe shaped portion 325, the active region 335 is inside the volume of memory material of the memory element 330, and thus is spaced away from the conductive contact 305 and the top electrode 340. The remaining portions of the memory element 330 can therefore provide thermal isolation to the active region 335 from the base portion 322 and the top electrode 340, which reduces the amount of current necessary to induce a phase change. In embodiments the memory material of the memory element 330 can have a thermal conductivity (k) in the highest thermal conductivity state less than that of the dielectric material of insulator element 350.

In addition, having the active region 335 inside the volume of memory material prevents etch damage issues to the active region 335 described above.

FIG. 3C is a table showing typical thermal properties of some commonly used materials, along with thermal properties of GST memory material. As can be seen in the table of FIG. 3C, GST has excellent thermal properties including small thermal conductivity and specific heat. Thus, by having the active region 335 inside the volume of memory material, in embodiments the memory element 330 can provide greater thermal isolation to the active region 335 than would be provided by dielectric materials, thus reducing the amount of current necessary to induce a phase change.

The pipe shaped portion 352 of the insulator element 350 can also provide some thermal isolation to the active region 335. Additionally, in embodiments the insulator element 350 can be formed on the outer surface of the bottom electrode 320 using thin film deposition techniques, and thus the thickness 353 of the element 350 can be very small. The small thickness 353 increases the thermal resistance of the insulator element 350, which restricts heat flow away from the active region 335 by the insulator element 350 and thereby helps to concentrate the heat flow to within the material of the memory element 330.

Figure 4:
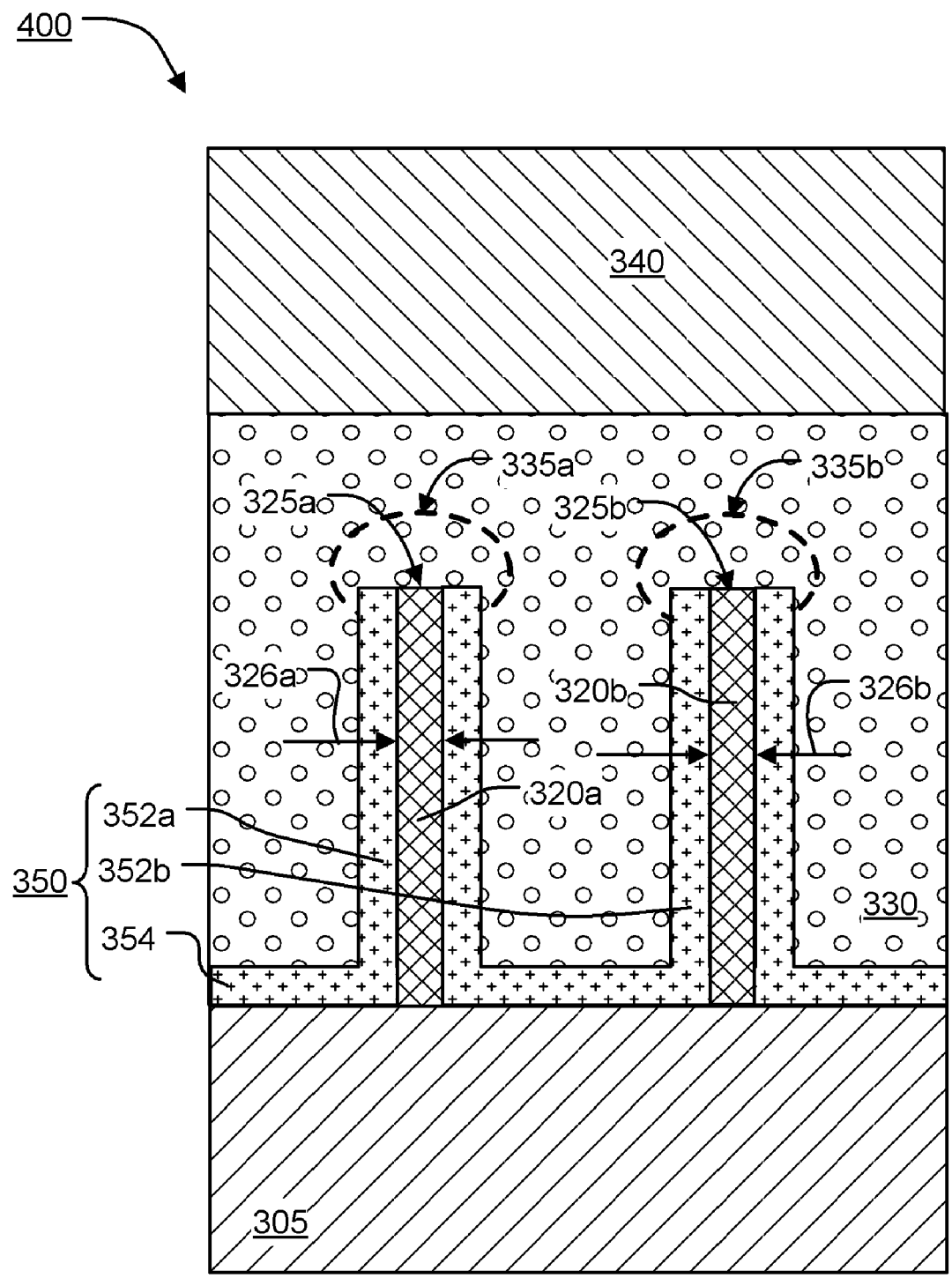
FIG. 4 is a cross-sectional view of a second embodiment of a memory cell described herein.

FIG. 4 illustrates a cross-sectional view of a second embodiment of a memory cell 400 which includes two bottom electrodes 320a, 320b and two corresponding pipe shaped portions 352a, 352b. In yet other embodiments more than two bottom electrodes and corresponding pipe shaped elements may be implemented.

In FIG. 4, the memory element 330 contacts the top surfaces 325a, 325b of the respective bottom electrodes 320a, 320b to electrically couple the conductive contact 305 to top electrode 340. In operation, voltages on the top electrode 340 and the conductive contact 305 induce a current to flow from the top electrode 340 to the contact surface 305, or vice versa, through top surfaces 325a, 325b of the bottom electrodes 320a, 320b and the memory element 330.

The active regions 335a, 335b are the regions of the memory element 330 in which the memory material is induced to change between at least two solid phases. As can be appreciated, the active regions 335, 335b can be made extremely small in the illustrated structure, thus reducing the magnitude of the current needed to induce a phase change. The small widths 326a, 326b concentrate current in the active regions 335a, 335b adjacent the top surfaces 325a, 325b of the bottom electrodes 320a, 320b respectively, thereby reducing the magnitude of current needed to induce a phase change in the active regions 335a, 335b.

In addition, the bottom electrodes 320a, 320b can act as a heater, because of the high resistivity in certain embodiments, inducing a greater temperature change in the active regions 335a, 335b for a given current flow than would otherwise occur, thus improving the efficiency of the phase change in the active regions 335a, 335b.

Furthermore, the small widths 326a, 326b of the bottom electrodes 320a, 320b provide a high thermal resistance path through the bottom electrodes 320a, 320b, thus restricting the amount of heat flow away from the active regions 335a, 335b of the memory element 330 to the conductive contact 305.

Since the memory element 330 surrounds the outer surfaces of the pipe shaped portions 352a, 352b and the top electrode 340 is spaced away from the distal ends of the pipe shaped portions 352a, 352b, the active regions 335a, 335b are inside the volume of memory material of the memory element 330 and thus spaced away from the conductive contact 305 and the top electrode 340. The remaining portions of the memory element 330 can therefore provide thermal isolation to the active regions 335a, 335b from the conductive contact 305 and the top electrode 340, which reduces the amount of current necessary to induce a phase change. In addition, having the active regions 335a, 335b inside the volume of memory material prevents etch damage issues to the active regions 335a, 335b.

By having the active regions 335a, 335b inside the volume of memory material, the memory element 330 can provide greater thermal isolation to the active region 335 than would be provided by dielectric materials, thus reducing the amount of current necessary to induce a phase change.

The pipe shaped portions 352a, 352b of the insulator element 350 can also provide some thermal isolation to the active regions 335a, 335b. Additionally, in embodiments the insulator element 350 can be formed on the outer surfaces of the bottom electrodes 320a, 320b using thin film deposition techniques, and thus the thickness of the pipe shaped portions 352a, 352b can be very small. The small thickness increases the thermal resistance of the insulator element 350, which restricts heat flow away from the active regions 335a, 335b by the element 350 and thereby helps to concentrate the heat flow to within the material of the memory element 330.

Figure 5A:
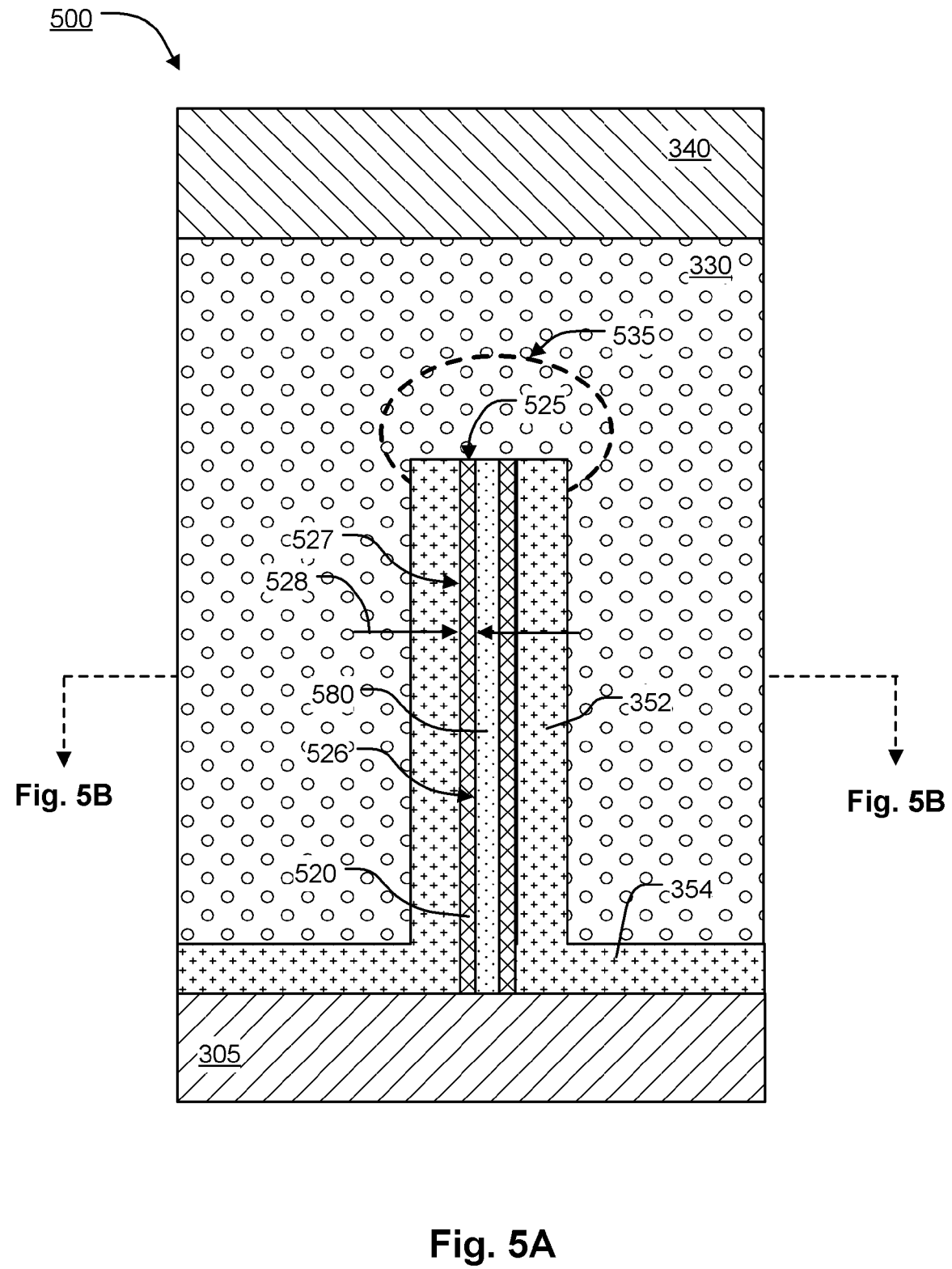
FIGS. 5A and 5B are cross-sectional and top views respectively of a third embodiment of a memory cell described herein.
Figure 5B:
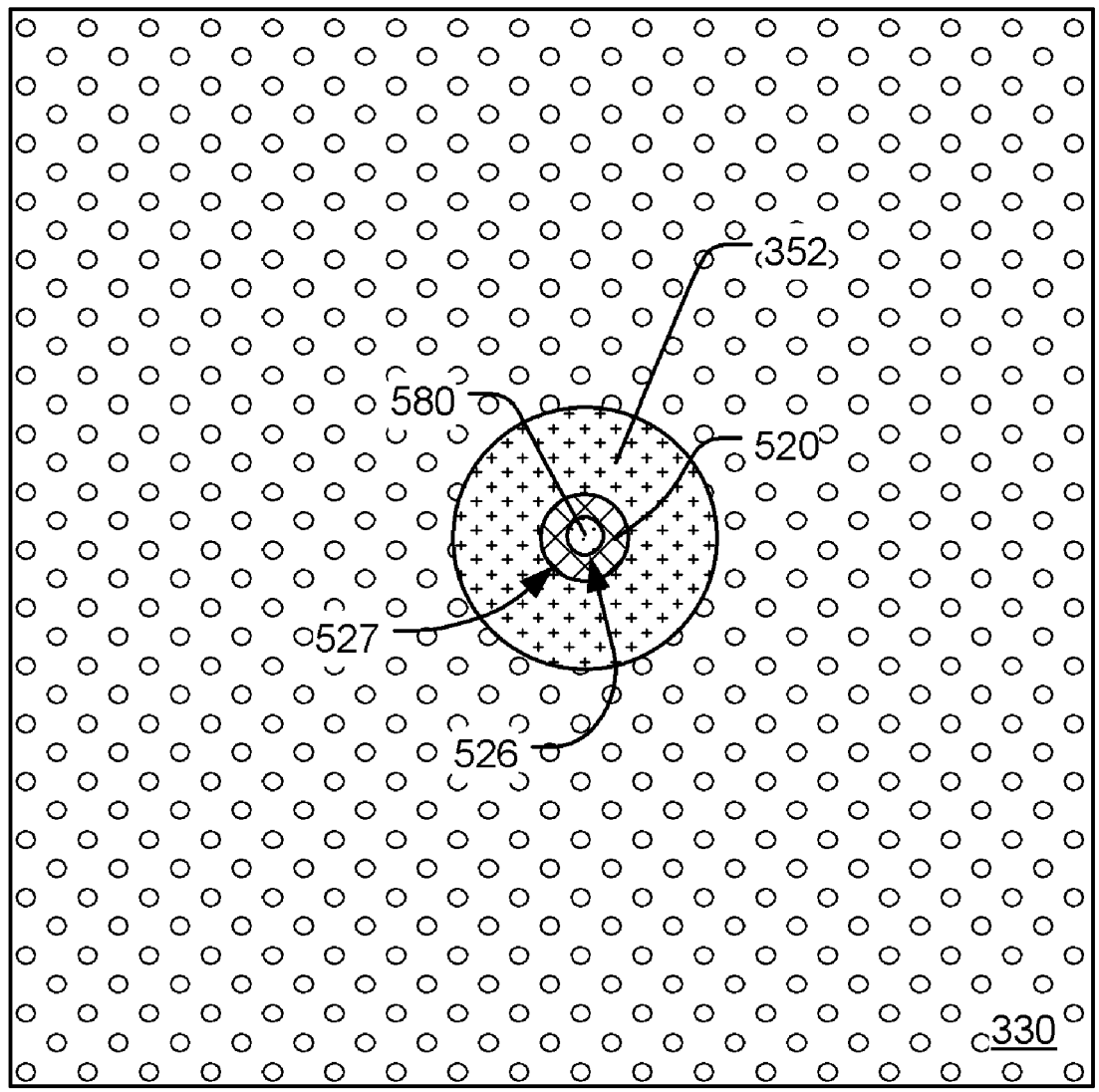
Figure 5C:
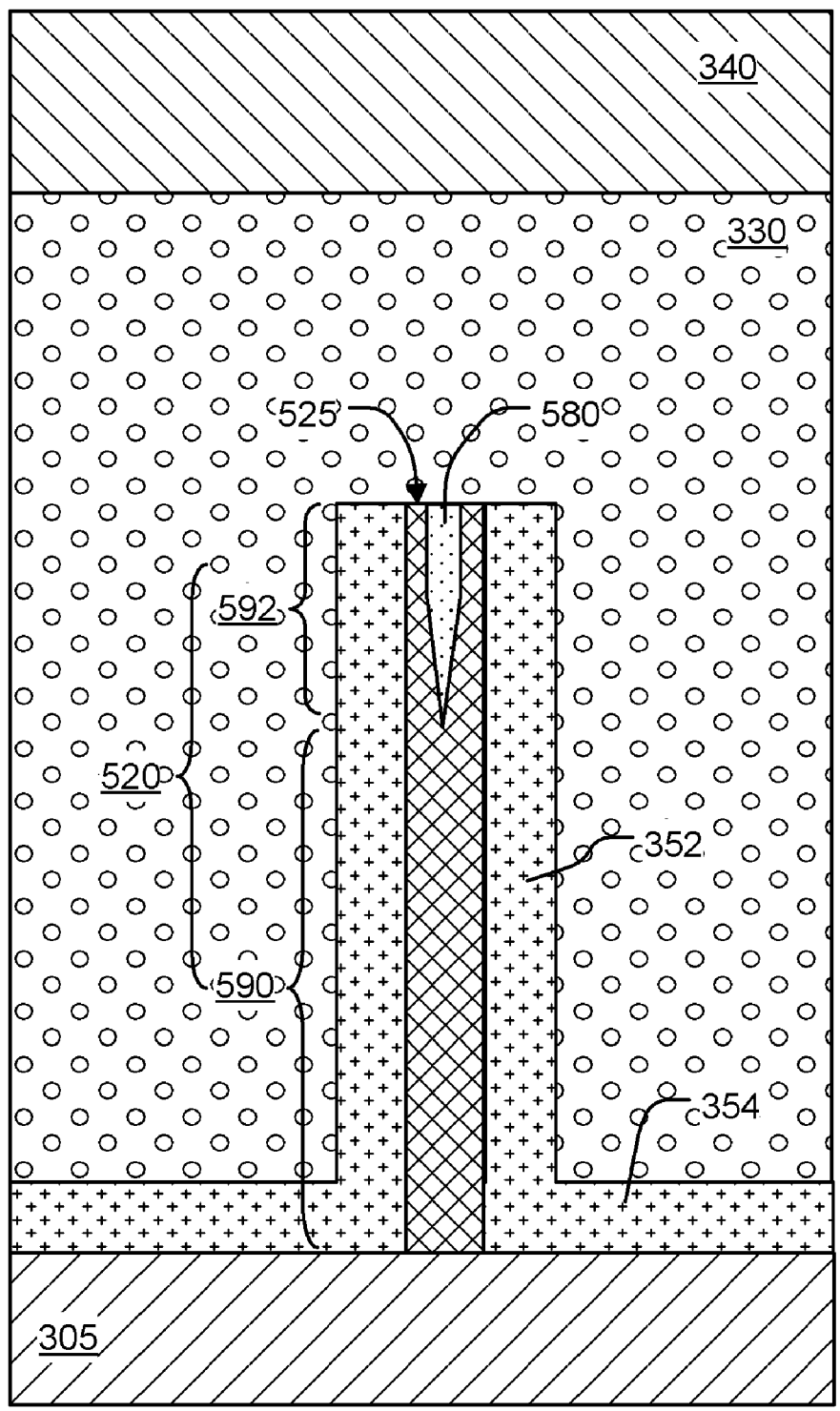
FIG. 5C is a cross-sectional view of alternative embodiment to that of FIGS. 5A and 5B.

FIGS. 5A and 5B illustrates cross-sectional and top views respectively of a third embodiment of a memory cell 500 which includes a bottom electrode 520 having a ring-shaped bottom electrode 520 having an inner surface 525 defining an interior containing fill material 580. In the illustrated embodiment of FIGS. 5A and 5B the fill material 580 extends from the top surface of the conductive contact 305 to the ring-shaped top surface 525 of the bottom electrode 520. As illustrated in FIG. 5C, in an alternative embodiment the bottom electrode 520 may include a solid portion 590 near the conductive contact 305 and a ring-shaped portion 592 near the top surface 525, the ring-shaped portion 582 defining an interior containing fill material 580.

The ring-shaped bottom electrode 520 may comprise, for example, a carbon nano tube. In the illustrated embodiment the fill material 580 is an electrically insulating material and may comprise material having a lower thermal conductivity than that of the ring-shaped bottom electrode 520. Alternatively, the fill material 580 may comprise an electrically conductive material, for example having an electrical conductivity different from that of the material of the bottom electrode 520.

As shown in the top view of FIG. 5B, in the illustrated embodiment the inside surface 526 and the outside surface 527 of the bottom electrode 520 define a circular cross-section for the bottom electrode 520. In embodiments the bottom electrode 520 may have a cross-section that is circular, elliptical, square, rectangular or somewhat irregularly shaped, depending on the manufacturing technique applied to form the bottom electrode 520. The "ring-shape" of the top surface 525 described herein, is therefore not necessarily circular, but rather takes the shape of the bottom electrode 520.

Referring back to FIG. 5A, the small width 528 of the bottom electrode 520 between the inner and outer surfaces 526, 527 results in a small ring-shaped top surface 525 of the bottom electrode 520 in contact with the memory element 330. The small ring-shape of the bottom electrode 520 concentrates current density in the portion of the memory element 330 adjacent the top surface 525, thereby reducing the magnitude of the current needed to induce phase change. The small width 528 of the bottom electrode 520 also increases the thermal resistance of the bottom electrode 520, thus restricting the amount of heat flow away from the active region 535 of the memory element 330 to the conductive contact 305.

FIGS. 6 to 14 illustrate steps in a fabrication sequence suitable for manufacturing the memory cell 300 of FIGS. 3A-3B.

Figure 6:
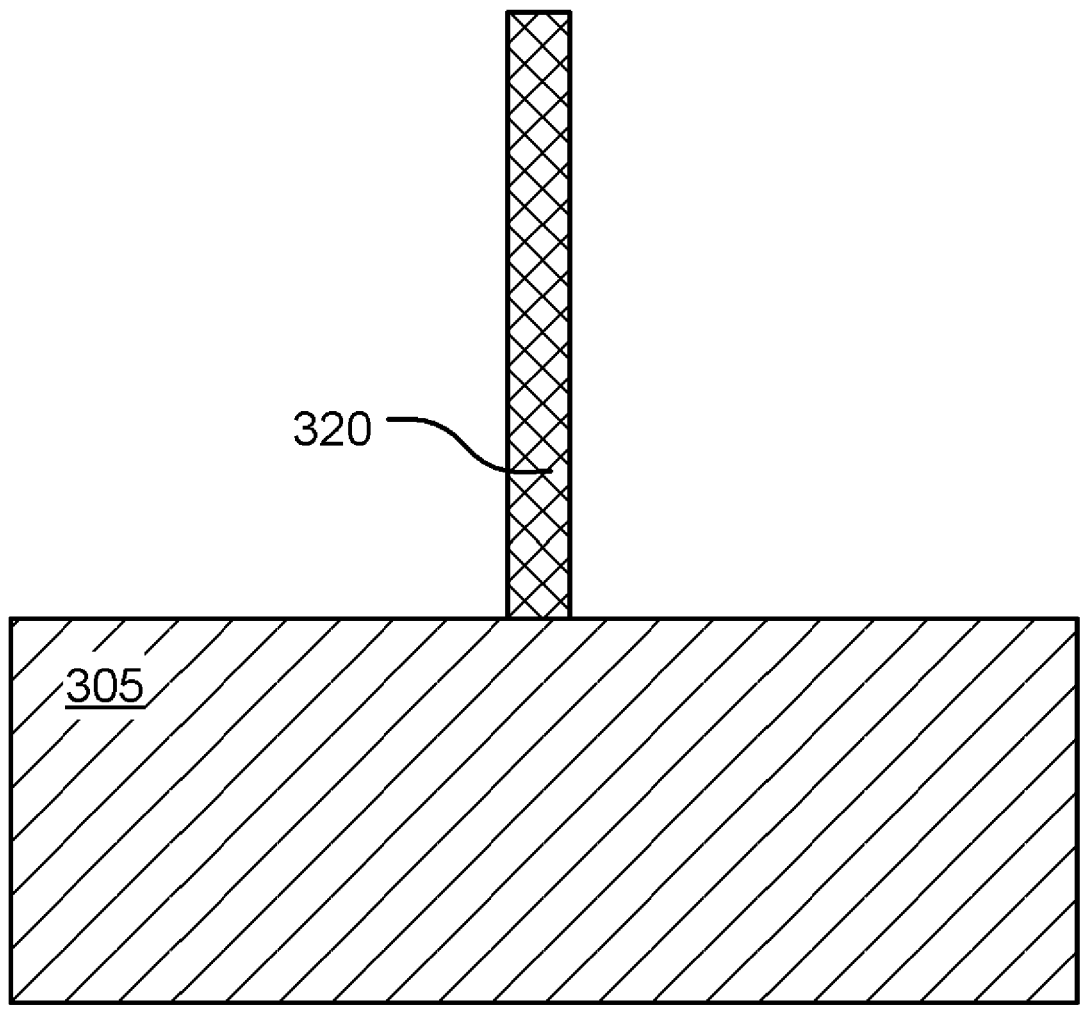
FIGS. 6 to 14 illustrate steps in a fabrication sequence suitable for manufacturing the memory cell of FIGS. 3A-3B.

FIG. 6 illustrates a first step of forming the conductive contact 305 and forming the bottom electrode 320 on the conductive contact 305.

Figure 7A:
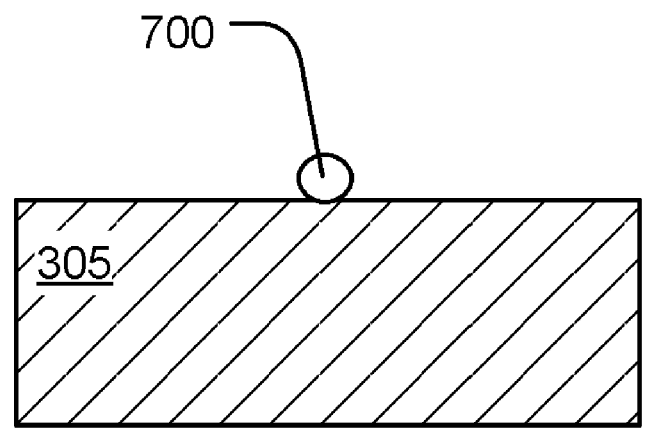
Figure 7B:
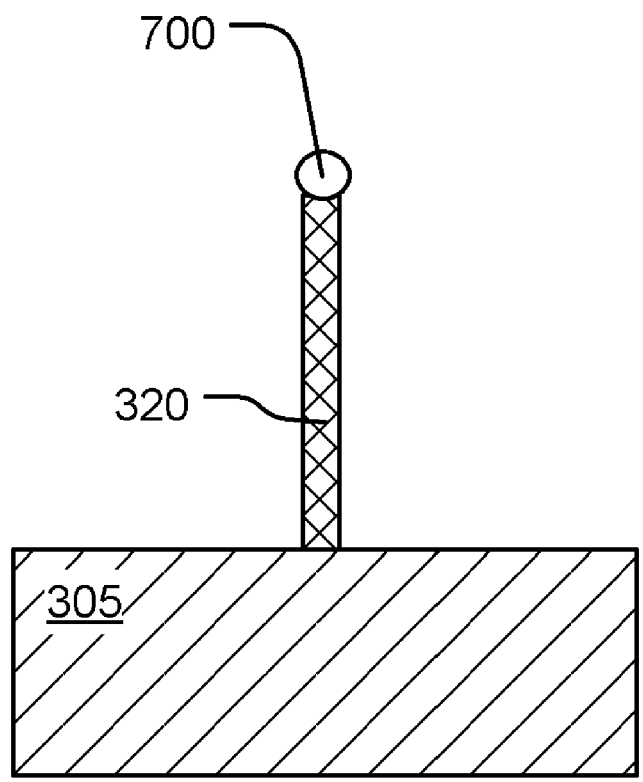

FIGS. 7A-7B illustrates steps in a first embodiment for manufacturing the bottom electrode 320 of FIG. 6 comprising the use of a nano-wire growth technique.

FIG. 7A illustrates a first step of forming a catalyst 700 on the conductive contact 305. The catalyst 700 comprises material that facilitates growth of the nano-wire bottom electrode 320 on the conductive contact 305. For example, the catalyst 700 may comprise material which facilitates formation of Si, Ge, or C for the bottom electrode 320. When growing a nano-wire bottom electrode 320 comprising silicon, the material of the deposited catalyst 700 may include, for example, gold, nickel, titanium, iron, cobalt, gallium, and respective alloys thereof The catalyst 700 may be deposited, for example, using physical vapor or chemical vapor techniques.

FIG. 7B illustrates growing the bottom electrode 320 at the site of the catalyst 700. Growing can comprise, for example, exposing the catalyst 700 to a controlled temperature, pressure, and a gas containing a material of the nano-wire bottom electrode 320 to be grown. In embodiments in which a plurality of bottom electrodes 320 are to be grown, catalysts can be formed at a plurality of sites on the conductive contact and bottom electrodes 320 grown at each of those sites.

Exemplary methods for forming the catalyst 700 and growing the bottom electrode 320 are disclosed in U.S. Pat. Nos. 6,831,017 and 6,720,240, and US Publication No. 2003/0189202, each of which are incorporated by reference herein.

In alternative embodiments the bottom electrode 320 may be formed using a catalyst-free nano-wire growth technique. An exemplary method for growing the bottom electrode 320 without the use of a catalyst is to perform a non-catalyst metal organic phase epitaxy (MOVPE) technique as disclosed in "GaN nanowire light emitting diodes based on templated and scalable nanowire growth" by Hersee, et al., IEEE Electronic Letters, Vol. 45 No. 1, 1 Jan. 2009, which is incorporated by reference herein.

Figure 8A:
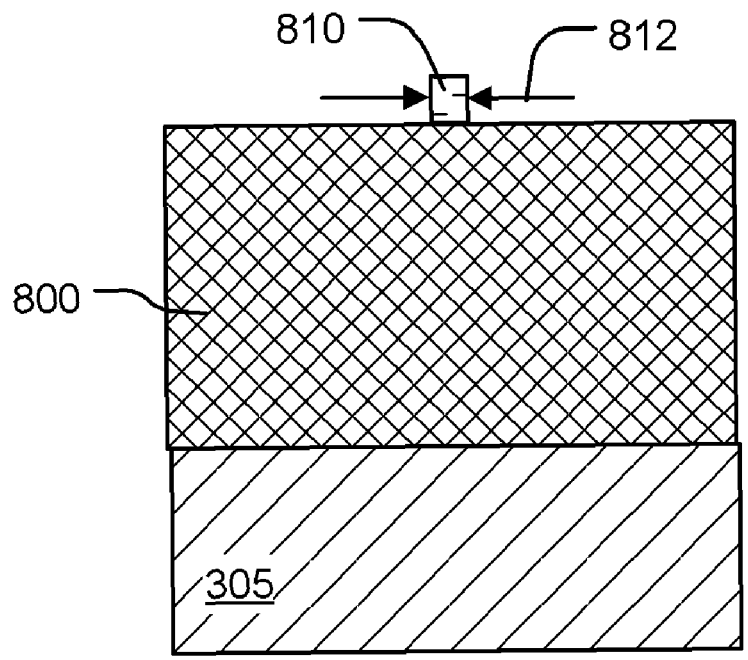
Figure 8B:
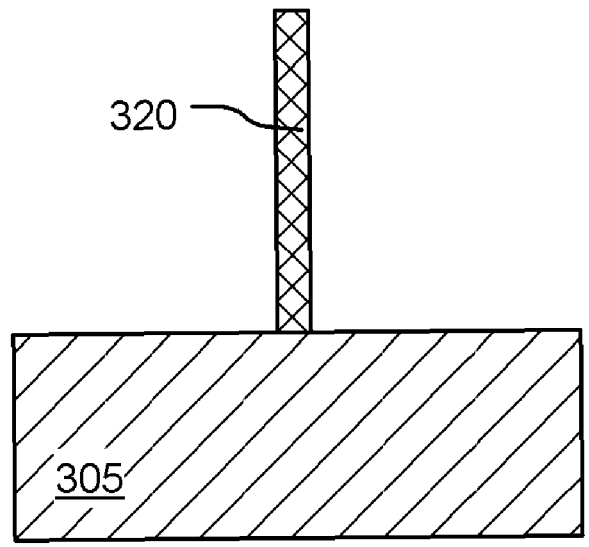

FIGS. 8A-8B illustrates steps in a second embodiment for manufacturing the bottom electrode 320 of FIG. 6.

FIG. 8A illustrates a first step of forming a layer 800 of bottom electrode material on the conductive contact 305, and forming a mask 810 on the layer 800. In embodiments in which a plurality of bottom electrodes are to be formed, the mask 810 comprises a plurality of mask elements.

In the illustrated embodiment the mask 810 comprises photoresist, and can be formed by patterning the layer of photoresist and then trimming the patterned layer so that the mask 810 has a sublithographic width 812.

Next, the layer 800 is etched using the mask 810 as an etch mask to form the bottom electrode 320 on the conductive contact 305, resulting in the structure illustrated in the cross-sectional view of FIG. 8B.

Figure 9A:
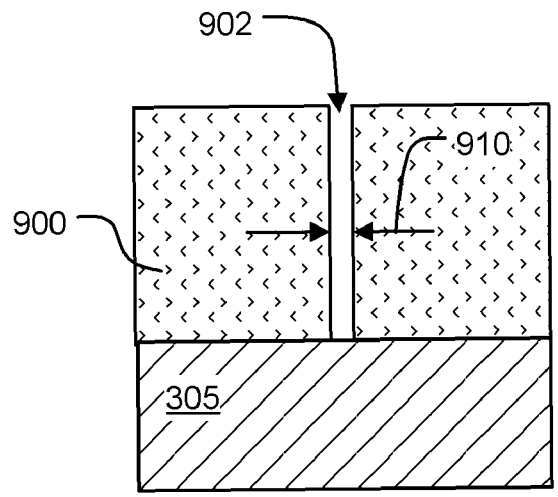
Figure 9B:
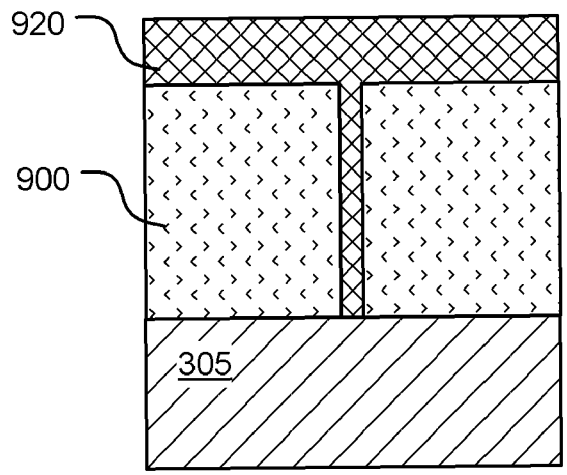
Figure 9C:
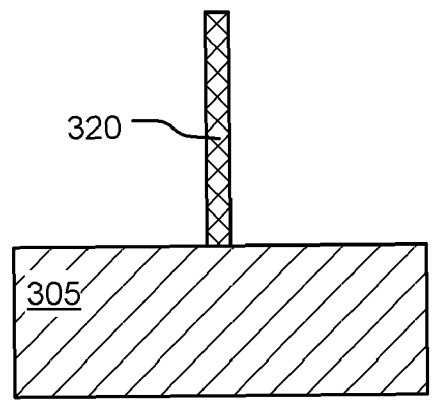

FIGS. 9A-9C illustrate steps in a third embodiment for manufacturing the bottom electrode 320 of FIG. 6.

FIG. 9A illustrates a first step of forming fill material layer 900 having an opening 902 on the conductive contact 305. The opening 902 having a sublithographic width 910 can be formed, for example, by forming an isolation layer on the layer 900 and forming a sacrificial layer on the isolation layer. Next, a mask having an opening close to or equal to the minimum feature size of the process used to create the mask is formed on the sacrificial layer, the opening overlying the location of the opening 902. The isolation layer and the sacrificial layer are then selectively etched using the mask, thereby forming a via in the isolation and sacrificial layers and exposing a top surface of the layer 900. After removal of the mask, a selective undercutting etch is performed on the via such that the isolation layer is etched while leaving the sacrificial layer and the layer 900 intact. A fill material is then formed in the via, which due to the selective undercutting etch process results in a self-aligned void in the fill material being formed within the via. Next, an anisotropic etching process is performed on the fill material to open the void, and etching continues until the layer 900 is exposed in the region below the via, thereby forming a sidewall spacer comprising fill material within the via. The sidewall spacer has an opening dimension substantially determined by the dimension of the void, and thus can be less than the minimum feature size of a lithographic process. Next, the layer 900 is etched using the sidewall spacer as an etch mask, thereby forming opening 902 having a width 910 less than the minimum lithographic feature size. The isolation layer and the sacrificial layer can be removed by a planarization process such as Chemical Mechanical Polishing (CMP).

Next, a layer 920 of bottom electrode material is formed on the structure illustrated in FIG. 9A, including within the opening 902, resulting in the structure illustrated in the cross-sectional view of FIG. 9B. The layer 920 can be formed, for example, by Chemical Vapor Deposition (CVD). In the illustrated embodiment the layer 920 completely fills the opening 902. Alternatively, the layer 920 can be deposited such that a void free of material of layer 920 is formed at the top of the opening 902, resulting in a bottom electrode 520 having a solid portion 590 and a ring-shaped portion 592 as illustrated in the embodiment of FIG. 5C.

Next, a planarization process such as CMP is performed to remove material of layer 920 above the layer 900, and then layer 900 is removed by a selective etch process, resulting in the structure illustrated in the cross-sectional view of FIG. 9C.

Figure 10:
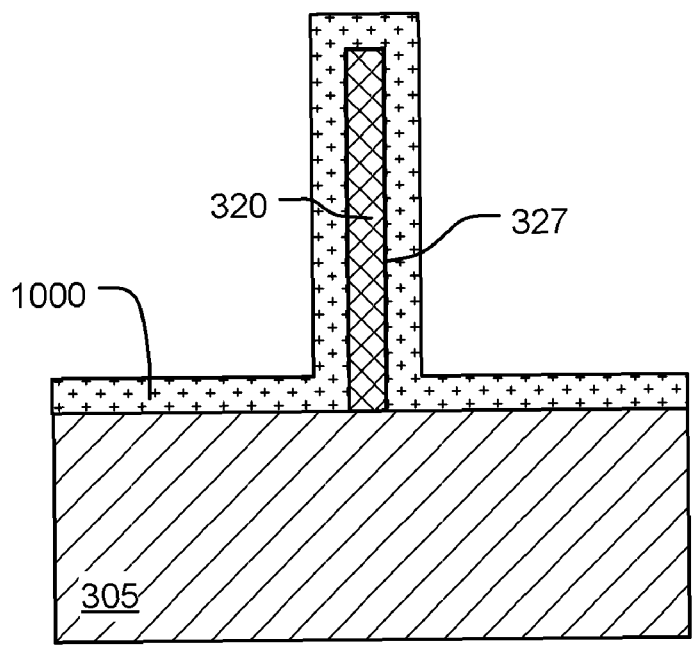

Next, a layer 1000 of insulator material is formed on the structure of FIG. 6, resulting in the structure illustrated in the cross-sectional view of FIG. 10. As can be seen in FIG. 10, the layer 1000 is conformal to the bottom electrode 320 to surround the outer surface 327 of the bottom electrode 320 and contact the top surface of the conductive contact 305. In the illustrated embodiment the layer 1000 comprises SiN. Alternatively, other materials may be used.

Figure 11:
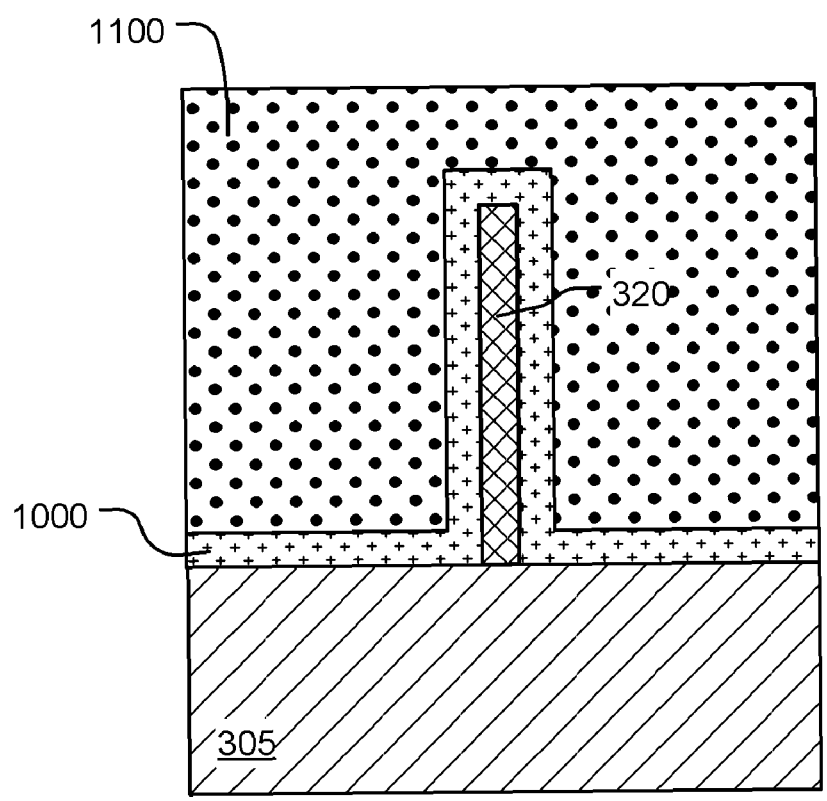

Next, fill material 1100 is formed on the structure illustrated in FIG. 10, resulting in the structure illustrated in the cross-sectional view of FIG. 11. The fill material 1100 comprises material that can be selectively processed (e.g. selectively etched) relative to the material of layer 1000 and bottom electrode 320. In the illustrate embodiment the fill material 1100 comprises silicon dioxide. Alternatively, other materials may be used.

Figure 12:
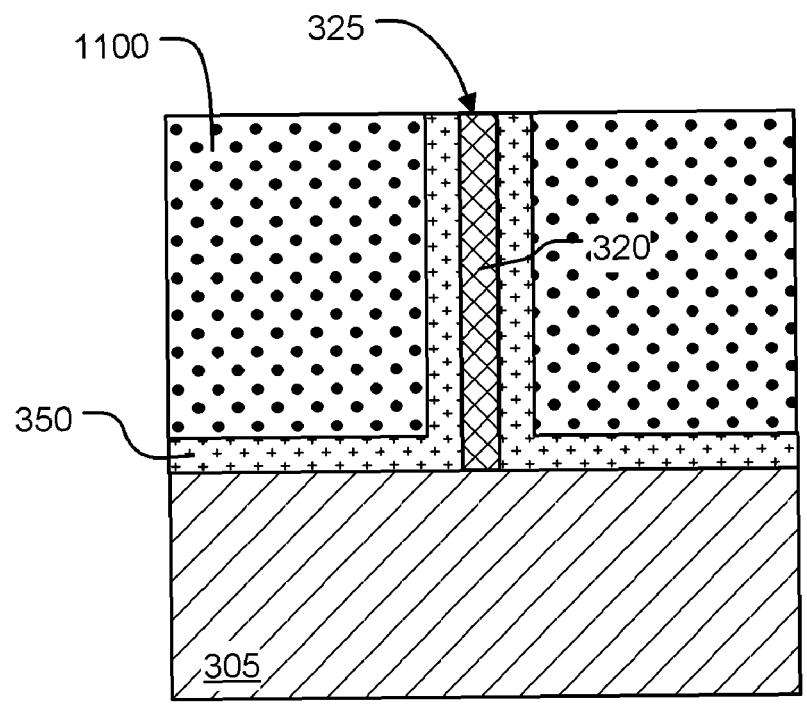

Next, a planarization process such as CMP is performed to expose the top surface 325 of the bottom electrode 320 and form the insulator element 350 from material of layer 1000, resulting in the structure illustrated in the cross-sectional view of FIG. 12.

Figure 13A:
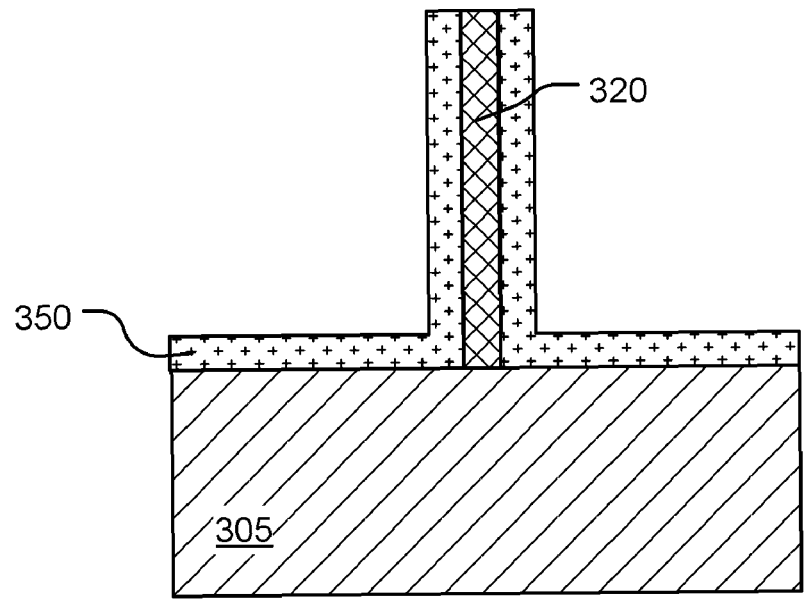
Figure 13B:
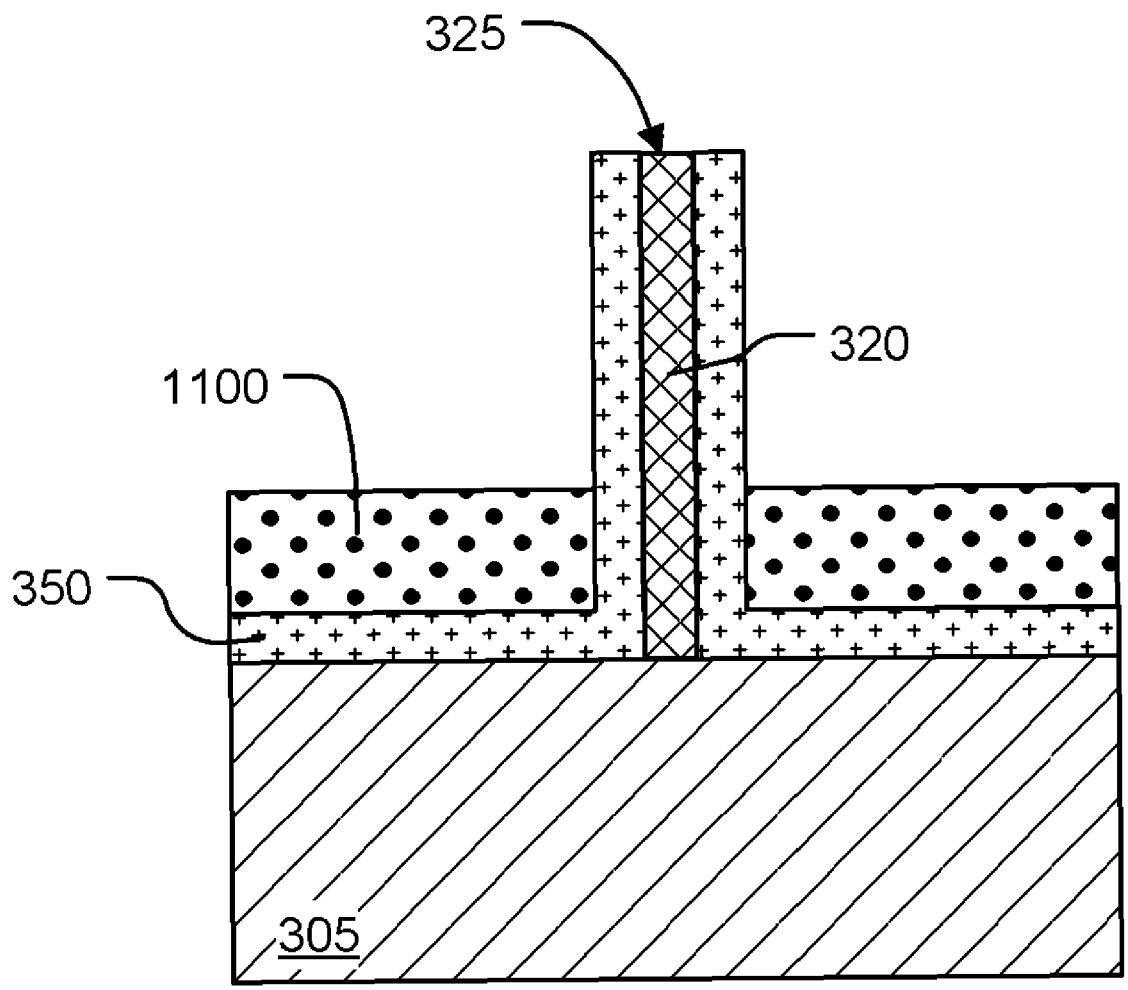

Next, the material of layer 1100 is selectively removed, for example by performing an isotropic etching process, resulting in the structure illustrated in the cross-sectional view of FIG. 13A. In one embodiment the material of layer 1100 is not completely removed and a portion remains overlying the conductive contact 305, resulting in the structure illustrated in the cross-sectional view of FIG. 13B.

Figure 14:
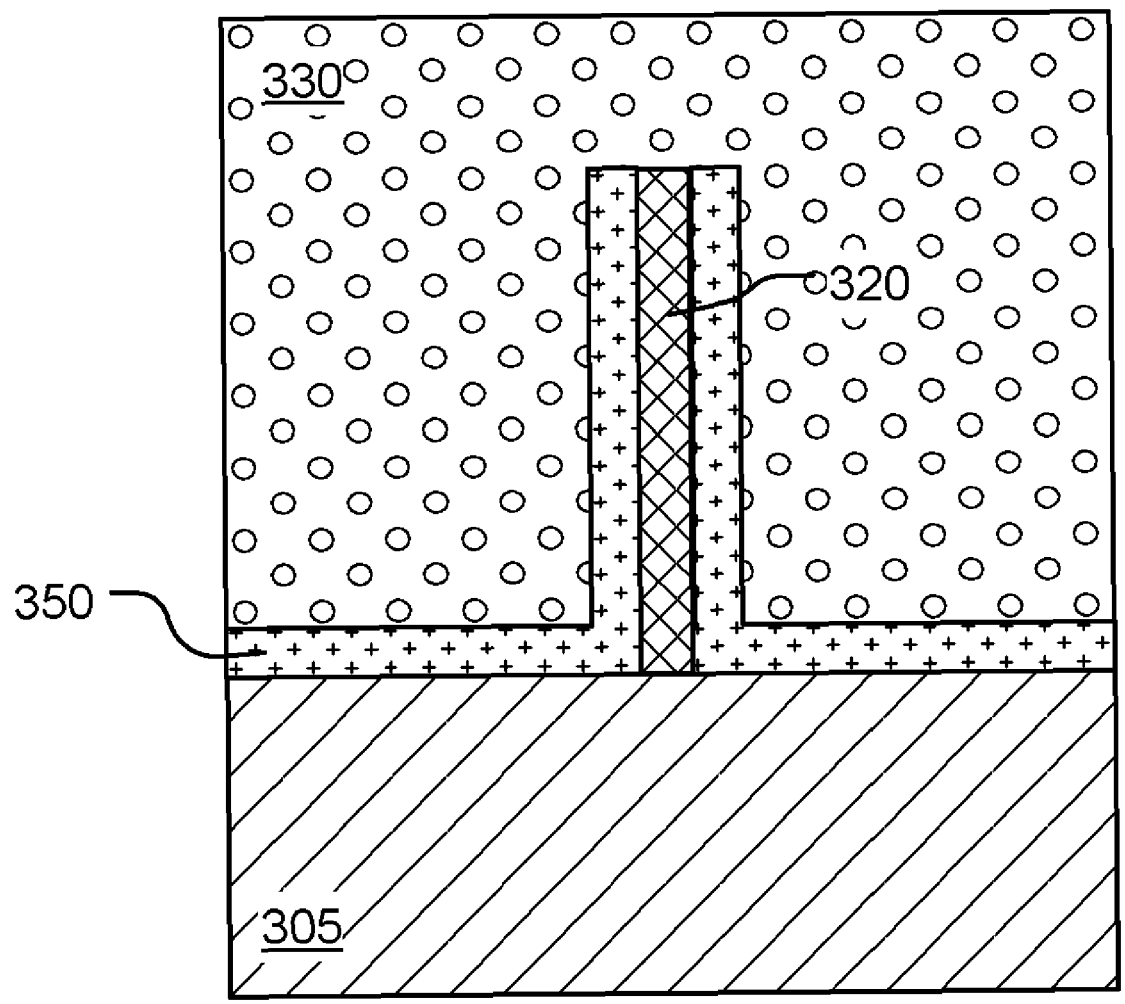

Next, memory element 330 is formed by depositing memory material on the structure illustrated in FIG. 13 including in contact with the top surface 325 of the bottom electrode 320, resulting in the structure illustrated in the cross-sectional view of FIG. 14.

Next, top electrode 340 is formed on the structure illustrated in FIG. 14, resulting in the memory cell 300 illustrated in FIGS. 3A-3B.

Figure 15:
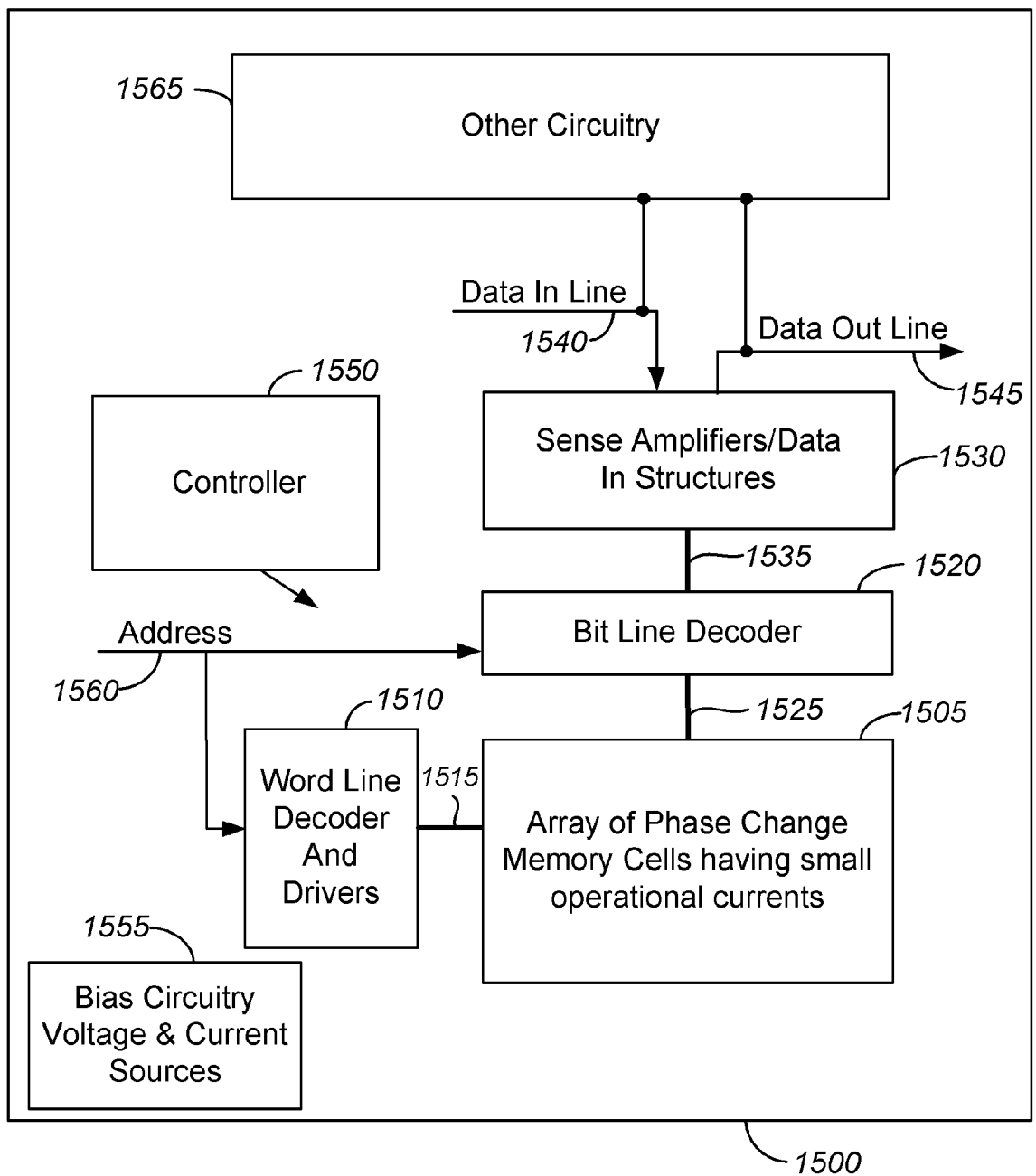
FIG. 15 is a simplified block diagram of an integrated circuit in which the memory cells described herein can be implemented.

FIG. 15 is a simplified block diagram of an integrated circuit 1500 including a memory array 1505 having memory cells as described herein having small operational currents, the memory cells including phase change memory elements programmable to a plurality of resistance states including a lower resistance state and a higher resistance state. A word line decoder 1510 having read, reset, reset verify, set verify, and set modes is coupled to and in electrical communication with a plurality of word lines 1515 arranged along rows in the memory array 1505. A bit line (column) decoder 1520 is in electrical communication with a plurality of bit lines 1525 arranged along columns in the array 1505 for reading and programming the memory cells (not shown) in array 1505.

Addresses are supplied on bus 1560 to word line decoder and drivers 1510 and bit line decoder 1520. Sense circuitry (Sense amplifiers) and data-in structures in block 1530, including voltage and/or current sources for the read and program modes are coupled to bit line decoder 1520 via data bus 1535. Data is supplied via a data-in line 1540 from input/output ports on integrated circuit 1500, or from other data sources internal or external to integrated circuit 1500, to data-in structures in block 1530. Other circuitry 1565 may be included on integrated circuit 1500, such as a general purpose processor or special purpose application circuitry, or a combination of modules providing system-on-a-chip functionality supported by array 1505. Data is supplied via a data-out line 1545 from the sense amplifiers in block 1530 to input/output ports on integrated circuit 1500, or to other data destinations internal or external to integrated circuit 1500.

The integrated circuit 1500 includes a controller 1550 for read, reset, reset verify, set verify, and set modes of the memory cells of the array 1505. The controller 1550, implemented in this example using a bias arrangement state machine, controls the application of bias circuitry voltage & current sources 1555 for the application of bias arrangements including read, set and reset to the word lines 1515, bit lines 1525, and in some embodiments source lines. Controller 1550 may be implemented using special-purpose logic circuitry as known in the art. In alternative embodiments, controller 1550 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1550.

Figure 16:
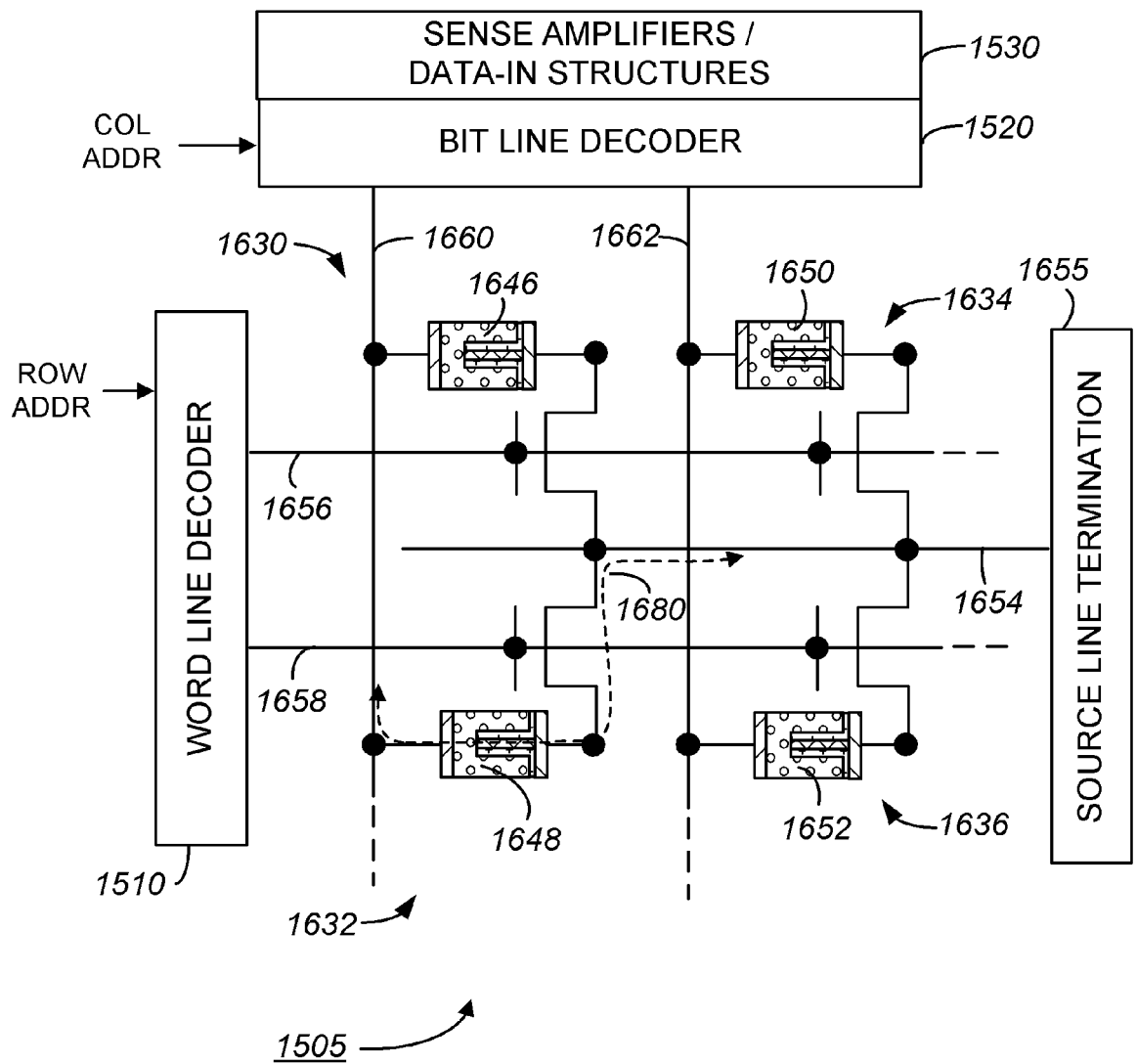
FIG. 16 is a schematic diagram of a portion of an embodiment of the memory array of the integrated circuit of FIG. 15.

As shown in FIG. 16, each of the memory cells of array 1505 includes an access transistor (or other access device such as a diode) and a phase change memory element. In FIG. 16 four memory cells 1630, 1632, 1634, 1636 having respective memory elements 1646, 1648, 1650, 1652 are illustrated, representing a small section of an array that can include millions of memory cells. The memory elements are programmable to a plurality of resistance states including a lower and a higher resistance state.

Sources of each of the access transistors of memory cells 1630, 1632, 1634, 1636 are connected in common to source line 1654 that terminates in source line termination circuit 1655, such as a ground terminal. In another embodiment the source lines of the access devices are not electrically connected, but independently controllable. The source line termination circuit 1655 may include bias circuitry such as voltage sources and current sources, and decoding circuits for applying bias arrangements, other than ground, to the source line 1654 in some embodiments.

A plurality of word lines including word lines 1656, 1658 extend in parallel along a first direction. Word lines 1656, 1658 are in electrical communication with word line decoder 1510. The gates of access transistors of memory cells 1630 and 1634 are connected to word line 1656, and the gates of access transistors of memory cells 1632 and 1636 are connected in common to word line 1658.

A plurality of bit lines including bit lines 1660, 1662 extend in parallel in a second direction and are in electrical communication with bit line decoder 1620. In the illustrated embodiment each of the memory elements are arranged between the drain of the corresponding access device and the corresponding bit line. Alternatively, the memory elements may be on the source side of the corresponding access device.

It will be understood that the memory array 1605 is not limited to the array configuration illustrated in FIG. 16, and additional array configurations can also be used. Additionally, instead of MOS transistors, bipolar transistors or diodes may be used as access devices in some embodiments.

In operation each of the memory cells in the array 1605 store data depending upon the resistance of the corresponding memory element. The data value may be determined, for example, by comparison of current on a bit line for a selected memory cell to that of a suitable reference current by sense amplifiers of sense circuitry 1630. The reference current can be established to that a predetermined range of currents correspond to a logical "0", and a differing range of currents correspond to a logical "1". In a memory cell having three or more states, reference currents can be established so that differing ranges of bit line currents correspond to each of the three or more states.

Reading, or writing to a memory cell of array 1605 can be achieved by applying a suitable voltage to one of word lines 1656, 1658 and coupling one of bit lines 1660, 1662 to a voltage so that current flows through the selected memory cell. For example, a current path 1680 through a selected memory cell (in this example memory cell 1632 and corresponding memory element 1648) is established by applying voltages to the bit line 1660, word line 1658, and source line 1654 sufficient to turn on the access transistor of memory cell 1632 and induce current in path 1680 to flow from the bit line 1660 to the source line 1654, or vice-versa. The level and duration of the voltages applied is dependent upon the operation performed.

In a reset (or erase) operation of memory cell 1632, word line decoder 1510 facilitates providing word line 1658 with a suitable voltage to turn on the access transistor of the memory cell 1632. Bit line decoder 1520 facilitates supplying one or more voltage pulses to bit line 1660 of suitable amplitude and duration to induce a current to flow though memory element 1648, thereby raising the temperature of at least the active region above the transition temperature of the phase change material of the memory element 1648 and also above the melting temperature to place at least the active region in a liquid state. The current is then terminated, for example by terminating the voltage pulse on the bit line 1660 and the voltage on the word line 1658, resulting in a relatively quick quenching time as the active region rapidly cools to stabilize to an amorphous phase.

In a read (or sense) operation of memory cell 1632, word line decoder 1510 facilitates providing word line 1658 with a suitable voltage to turn on the access transistor of the memory cell 1632. Bit line decoder 1520 facilitates supplying a voltage to bit line 1660 of suitable amplitude and duration to induce current to flow that does not result in the memory element 1648 undergoing a change in resistive state. The current on the bit line 1660 and through the memory element 1648 is dependent upon the resistance of, and therefore the data state associated with, the memory element 1648 of the memory cell 1632. Thus, the data state of the memory cell 1632 may be determined, for example by comparison of the current on bit line 1660 with a suitable reference current by sense amplifiers of sense circuitry 1530.

In a set (or program) operation of memory cell 1632, word line decoder 1510 facilitates providing word line 1658 with a suitable voltage to turn on the access transistor of the memory cell 1632. Bit line decoder 1520 facilitates supplying a voltage to bit line 1660 of suitable amplitude and duration to induce current to flow through the memory element 1648, thereby raising the temperature of a least a portion of the active region above the transition temperature of the phase change material to cause a transition of at least a portion of the active region from the amorphous phase to the crystalline phase, this transition lowering the resistance of the memory element 1648 and setting the memory cell 1632 to the desired state.

Embodiments of memory material of the memory elements described herein include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a-b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
a conductive contact;
a memory element comprising programmable resistance memory material overlying the conductive contact;
an insulator element including a plurality of pipe shaped portions extending from the conductive contact into the memory element, the pipe shaped portions having respective proximal and distal ends and an inside surface defining an interior, the proximal ends adjacent the conductive contact;
a plurality of bottom electrodes contacting the conductive contact and extending upwardly within the interior of a corresponding pipe shaped portion from the proximal end to the distal end, the bottom electrodes having respective top surfaces contacting the memory element adjacent the distal end of the corresponding pipe shaped portion at respective first contact surfaces; and
a top electrode separated from the distal ends of the pipe shaped portion by the memory element and contacting the memory element at a second contact surface, the second contact surface having a surface area greater than that of the first contact surfaces.

2. The memory device of claim 1, wherein the insulator element further includes base portions at the proximal ends of the plurality of pipe shaped portions, the base portions on a top surface of the conductive contact and separating the conductive contact from the memory element.

3. The memory device of claim 1, wherein the plurality of bottom electrodes have corresponding inside surfaces defining second interiors, and further comprising an electrically insulating fill material within the second interiors.

4. The memory device of claim 1, wherein the plurality of bottom electrodes comprise material having an electrical resistivity greater than that of material of the conductive contact.

5. The memory device of claim 1, wherein the programmable resistance memory material has a thermal conductivity less than that of material of the insulator element.

6. The memory device of claim 1, wherein the interior of respective pipe shaped portions have substantially the same width at the corresponding proximal and distal ends.

7. A method for manufacturing a memory device, the method comprising:
forming a conductive contact;
forming a memory element comprising programmable resistance memory material overlying the conductive contact;

forming an insulator element including a plurality of pipe shaped portions extending from the conductive contact into the memory element, the pipe shaped portions having respective proximal and distal ends and an inside surface defining an interior, the proximal ends adjacent the conductive contact;

forming a plurality of bottom electrodes contacting the conductive contact and extending upwardly within the interior of a corresponding pipe shaped portion from the proximal end to the distal end, the bottom electrodes having top surfaces contacting the memory element adjacent the distal end of the corresponding pipe shaped portion at respective first contact surfaces; and forming a top electrode separated from the distal ends of the pipe shaped portion by the memory element and contacting the memory element at a second contact surface, the second contact surface having a surface area greater than that of the first contact surfaces.

8. The method of claim 7, wherein forming the plurality of bottom electrodes comprises growing the plurality of bottom electrodes on the conductive contact using a nano-wire growth process.

9. The method of claim 7, wherein forming the plurality of bottom electrodes comprises:
   depositing bottom electrode material on the conductive contact;
   forming a mask on the bottom electrode material; and
   etching the bottom electrode material using the mask as an etch mask.

10. The method of claim 7, wherein forming the plurality of bottom electrodes comprises:
    forming a sacrificial material layer on the conductive contact;
    forming openings extending through the sacrificial material layer;
    forming the plurality of bottom electrodes within the opening to contact the conductive contact; and
    removing the sacrificial material layer.

11. The method of claim 7, wherein forming the insulator element comprises:
    depositing insulator material on the top and outside surfaces of the bottom electrodes, and on a top surface of the conductive contact;
    forming a fill material on the insulator material;
    planarizing the fill material and the insulator material to expose the top surfaces of the bottom electrodes, thereby forming the insulator element; and
    removing the fill material to expose the outside surfaces of the pipe shaped portions of the insulator element.

12. The method of claim 11, wherein removing the fill material comprises removing a portion of the fill material, remaining fill material surrounding lower portions of the pipe shaped portions.

13. The method of claim 7, wherein the plurality of bottom electrodes have corresponding inside surfaces defining second interiors, and further comprising forming an electrically insulating fill material within the second interiors.

14. The method of claim 7, wherein the plurality of bottom electrodes have corresponding inside surfaces defining second interiors, and further comprising forming an electrically conductive fill material within the second interiors, the electrically conductive fill material having an electrical conductivity different from that of material of the plurality of bottom electrodes.

15. The method of claim 7, wherein forming the plurality of bottom electrodes and forming the insulator element comprise:
    growing the plurality of bottom electrodes on the conductive contact using a nano-wire growth technique; and
    forming the insulator element on the outside of the plurality of bottom electrodes.

* * * * *